(12) United States Patent
Kumon et al.

(10) Patent No.: US 9,748,092 B2
(45) Date of Patent: Aug. 29, 2017

(54) LIQUID CHEMICAL FOR FORMING PROTECTING FILM

(71) Applicant: Central Glass Company, Limited, Ube-shi, Yamaguchi (JP)

(72) Inventors: Soichi Kumon, Matsusaka (JP); Takashi Saio, Suzuka (JP); Shinobu Arata, Matsusaka (JP); Masanori Saito, Matsusaka (JP); Atsushi Ryokawa, Ube (JP); Shuhei Yamada, Ube (JP); Hidehisa Nanai, Tokyo (JP); Yoshinori Akamatsu, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 90 days.

(21) Appl. No.: 14/952,354

(22) Filed: Nov. 25, 2015

(65) Prior Publication Data

US 2016/0148802 A1 May 26, 2016

Related U.S. Application Data

(60) Division of application No. 13/253,127, filed on Oct. 5, 2011, now Pat. No. 9,228,120, which is a
(Continued)

(30) Foreign Application Priority Data

| Jun. 7, 2010 | (JP) | ................................. 2010-129810 |
| Jun. 29, 2010 | (JP) | ................................. 2010-148221 |
| Apr. 13, 2011 | (JP) | ................................. 2011-089033 |

(51) Int. Cl.
| *H01L 21/02* | (2006.01) |
| *C09K 3/18* | (2006.01) |
(Continued)

(52) U.S. Cl.
CPC .......... *H01L 21/02057* (2013.01); *B08B 3/08* (2013.01); *B08B 3/10* (2013.01);
(Continued)

(58) Field of Classification Search
CPC .................................................. C11D 11/0047
See application file for complete search history.

(56) References Cited

U.S. PATENT DOCUMENTS

| 5,326,672 A | 7/1994 | Tanaka et al. |
| 5,374,502 A | 12/1994 | Tanaka et al. |
(Continued)

FOREIGN PATENT DOCUMENTS

| CN | 1347340 A | 5/2002 |
| CN | 101276158 A | 10/2008 |
(Continued)

OTHER PUBLICATIONS

International Search Report including partial English language translation dated Aug. 16, 2011 (Nine (9) pages).
(Continued)

*Primary Examiner* — Gregory Webb
(74) *Attorney, Agent, or Firm* — Crowell & Moring LLP

(57) ABSTRACT

Disclosed is a liquid chemical for forming a water-repellent protecting film at least on a surface of a recessed portion of an uneven pattern at the time of cleaning a wafer having a finely uneven pattern at its surface and containing silicon at at least a part of the uneven pattern. This liquid chemical contains a silicon compound A represented by the general formula: $R^1{}_a Si(H)_b X_{4-a-b}$ and an acid A, the acid A being at least one selected from the group consisting of trimethylsilyl trifluoroactate, trimethylsilyl trifluoromethanesulfonate, dimethylsilyl trifluoroactate, dimethylsilyl trifluoromethanesulfonate, butyldimethylsilyl trifluoroactate, butyldimethylsilyl trifluoromethanesulfonate, hexyldimethylsilyl tri-
(Continued)

fluoroacetate, hexyldimethylsilyl trifluoromethanesulfonate, octyldimethylsilyl trifluoroactate, octyldimethylsilyl trifluoromethanesulfonate, decyldimethylsilyl trifluoroacetate and decyldimethylsilyl trifluoromethanesulfonate.

6 Claims, 2 Drawing Sheets

Related U.S. Application Data continuation-in-part of application No. 12/902,816, filed on Oct. 12, 2010, now abandoned.

(51) Int. Cl.
- *B08B 3/08* (2006.01)
- *B08B 3/10* (2006.01)
- *C11D 1/82* (2006.01)
- *C11D 3/16* (2006.01)
- *C11D 11/00* (2006.01)

(52) U.S. Cl.
CPC .......... C09K 3/18 (2013.01); H01L 21/02082 (2013.01); *C11D 1/82* (2013.01); *C11D 3/162* (2013.01); *C11D 11/0047* (2013.01)

(56) References Cited

U.S. PATENT DOCUMENTS

| | | | |
|---|---|---|---|
| 7,749,909 B2 | 7/2010 | Tomita et al. | |
| 8,828,144 B2* | 9/2014 | Kumon | H01L 21/02057 |
| | | | 134/1.1 |
| 9,090,782 B2* | 7/2015 | Saio | H01L 21/02057 |
| 9,228,120 B2* | 1/2016 | Kumon | C09K 3/18 |
| 2004/0176621 A1 | 9/2004 | Weisbeck et al. | |
| 2005/0119360 A1 | 6/2005 | Kawakami et al. | |
| 2008/0241489 A1 | 10/2008 | Ishibashi et al. | |
| 2009/0311874 A1 | 12/2009 | Tomita et al. | |
| 2010/0075504 A1 | 3/2010 | Tomita et al. | |
| 2010/0240219 A1 | 9/2010 | Tomita et al. | |
| 2010/0294306 A1 | 11/2010 | Mochizuki et al. | |
| 2011/0221077 A1 | 9/2011 | Ishibashi et al. | |

FOREIGN PATENT DOCUMENTS

| | | | |
|---|---|---|---|
| JP | 5-299336 A | 11/1993 |
| JP | 8-164517 A | 6/1996 |
| JP | 8-325259 A | 12/1996 |
| JP | 2002-542031 A | 12/2002 |
| JP | 2005-244203 A | 9/2005 |
| JP | 2008-198958 A | 8/2008 |
| JP | 2008-277748 A | 11/2008 |
| JP | 2010-114414 A | 5/2010 |
| WO | WO 2005/071756 A1 | 8/2005 |
| WO | WO 2007/055207 A1 | 5/2007 |
| WO | WO 2009/072529 A1 | 6/2009 |
| WO | WO 2009/104748 A1 | 8/2009 |

OTHER PUBLICATIONS

PCT/ISA/237 Form (Three (3) pages) (Aug. 16, 2011).
Invitation to Respond to Written Opinion by Intellectual Property Office of Singapore dated May 7, 2014, including Written Opinion and Search Report of Hungarian Intellectual Property Office dated Feb. 13, 2014 (fifteen (15) pages).
Japanese Office Action (JP 2012-519357) dated Sep. 26, 2014 (three (3) pages).
Japanese Office Action dated Apr. 21, 2015 (Four (4) pages).
Abstract of JP4403202 B1 (Corresponds to A3 & A5) published Jan. 27, 2010 (One (1) page).
Japanese Industrial Standard JIS R 3257, 1999, (Sixteen (16) pages).
Japanese Industrial Standard JIS B 0601, 2003, (Sixteen (16) pages).
Chinese Office Action issued in counterpart Chinese Application No. 201180028305.8 dated Jul. 2, 2015 (eight (8) pages).

\* cited by examiner

LIQUID CHEMICAL FOR FORMING PROTECTING FILM

CROSS REFERENCE TO RELATED APPLICATIONS

This application is a divisional of U.S. application Ser. No. 13/253,127, filed Oct. 5, 2011, which is continuation in part of U.S. application Ser. No. 12/902,816, filed Oct. 12, 2010, which in turn claims the benefit of priority under 35 U.S.C. §119 to Japanese Patent application Ser. Nos. JP 2011-089033, filed Apr. 13, 2011, JP 2010-148221, filed Jun. 29, 2010 and JP 2010-129810, filed Jun. 7, 2010, the disclosures of which are expressly incorporated by reference herein.

TECHNICAL FIELD

The present invention relates to a technique of cleaning a substrate (a wafer) in production of semiconductor devices or the like which technique aims to improve the production yield of devices having such a circuit pattern as to be particularly fine and particularly high in aspect ratio, and more particularly to a liquid chemical for forming a water-repellent protecting film which liquid chemical aims to improve a cleaning step which tends to induce the collapse of an uneven pattern in the wafer having at its surface a finely uneven pattern.

BACKGROUND OF THE INVENTION

Semiconductor devices for use in networks or digital household electric appliances are being further desired to be sophisticated, multifunctional, and low in power consumption. Accordingly, the trend toward micro-patterning for circuits has been developed, with which micro-sizing of particles has advanced to cause reduction in production yield. As a result of this, a cleaning step for the purpose of removing contaminants such as the micro-sized particles and the like is frequently used. As a result of this, 30-40% of the whole of the semiconductor fabrication process is occupied with the cleaning step.

On the other hand, in cleaning conventionally performed with a mixed ammonia cleaning agent, damages to the wafer due to its basicity are getting serious with the trend toward micro-patterning for circuits. Therefore, alternation with a dilute hydrofluoric acid-based cleaning agent is taking place.

With this, problems about the damages to the wafer due to cleaning have been solved; however, problems due to an aspect ratio increased with the trend toward micro-processing in the semiconductor devices have become obvious. In other words, a phenomenon where the pattern collapses when a gas-liquid interface passes through the pattern is brought about after cleaning or rinsing to largely reduce the yield, which has become a significant problem.

The pattern collapse occurs at the time of drawing the wafer out of a cleaning liquid or a rinsing liquid. It is said that the reason thereof is that a difference in height of residual liquid between a part of high aspect ratio and a part of low aspect ratio causes a difference in capillary force which acts on the pattern.

Accordingly, it is expected, by decreasing the capillary force, that the difference in capillary force due to the difference in height of residual liquid is reduced thereby resolving the pattern collapse. The magnitude of the capillary force is the absolute value of P obtained by the equation as represented below. It is expected from this equation that the capillary force can be reduced if decreasing $\gamma$ or cos $\theta$.

$$P = 2 \times \gamma \times \cos \theta / S$$

($\gamma$: Surface tension, $\theta$: Contact angle, S: Pattern width).

In Patent Publication 1, a technique of replacing water serving as a cleaning agent with 2-propanol before the gas-liquid interface passes through the pattern is disclosed as a method of decreasing $\gamma$ to suppress the pattern collapse. This method is effective for preventing the pattern collapse; however, a solvent having small $\gamma$ such as 2-propanol and the like is also small in normal contact angle, which results in the trend to increase cos $\theta$. It is therefore said that there are limitations to adaptable patterns, for example, an aspect ratio of not higher than 5.

Additionally, in Patent Publication 2, a technique directed to a resist pattern is disclosed as a method for decreasing cos $\theta$ to suppress the pattern collapse. This method is a method of setting a contact angle to around 90° to bring cos $\theta$ close to 0 so as to reduce the capillary force to the limit thereby suppressing the pattern collapse. However, the thus disclosed technique cannot be applied to the present object because: the technique is directed to the resist pattern or for reforming a resist itself; and a final removal together with the resist is possible so as not to need the assumption about a method of removing a treatment agent after drying.

Additionally, in Patent Publication 3, there is disclosed a cleaning method including: surface-reforming an unevenly patterned wafer surface with a silicon-containing film; forming a water-repellent protecting film on the surface by using a water-soluble surfactant or a silane coupling agent; reducing the capillary force; and thereby preventing the pattern collapse. However, the water repellent used as above is sometimes not sufficient for a water repellency-providing effect.

Additionally, the use of a critical fluid, the use of liquid nitrogen or the like are proposed as the method of preventing the pattern collapse of the semiconductor devices. However, any of these is difficult to apply to a mass-producing process because of its poorer throughput than in conventional cleaning steps, though effective to some extent.

REFERENCES ABOUT PRIOR ART

Patent Publication

Patent Publication 1: Japanese Patent Application Publication No. 2008-198958
Patent Publication 2: Japanese Patent Application Publication No. 5-299336
Patent Publication 3: Japanese Patent No. 4403202

SUMMARY OF THE INVENTION

In production of semiconductor devices, a wafer surface is made a surface having a finely uneven pattern. An object of the present invention is to provide a liquid chemical for forming a protecting film which liquid chemical forms a water-repellent protecting film on the unevenly patterned wafer surface, in order to improve a cleaning step which tends to induce a pattern collapse, without lowering throughput.

The liquid chemical according to the present invention, which liquid chemical being for forming the protecting film and being able to form the water-repellent protecting film on the unevenly patterned surface of the wafer (hereinafter referred to as "a liquid chemical for forming a protecting film" or merely as "a liquid chemical"), is a liquid chemical for forming a water-repellent protecting film (hereinafter referred to as "a water-repellent protecting film" or merely as "a protecting film") when cleaning a wafer having at its surface a finely uneven pattern at least a part of which contains silicon element, on at least a surface of a recessed portion of the uneven pattern. The liquid chemical is characterized by comprising:

a silicon compound A represented by the following general formula [1]; and an acid A, wherein the acid A is at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate and decyldimethylsilyl trifluoromethanesulfonate.

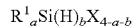

$$R^1{}_a Si(H)_b X_{4-a-b} \qquad [1]$$

(In the formula [1], $R^1$ mutually independently represents at least one group selected from a monovalent organic group having hydrocarbon group of which carbon number is 1 to 18 and a monovalent organic group having a fluoroalkyl chain of which carbon number is 1 to 8. X mutually independently represents a monovalent organic group of which element to be bonded to Si element is nitrogen. a is an integer of from 1 to 3. b is an integer of from 0 to 2. The total of a and b is 1 to 3.)

$R^1$ shown in the above-mentioned general formula [1] reduces a surface energy of the protecting film thereby reducing the interaction between water or another liquid and the surface of the protecting film (i.e., at the interface), such as hydrogen bond, intermolecular forces and the like. The effect of reducing the interaction against water is particularly outstanding, but there is also exhibited an effect of reducing the interaction against a mixture liquid of water and a liquid other than water or against a liquid other than water. With this, the contact angle of the liquid to an article surface can be increased.

The protecting film is formed by chemical bond between X of the general formula [1] and Si element in the silicon wafer. Since the protecting film is formed on the surface of the recessed portion, the capillary force of the recessed portion surface is to decrease when a cleaning liquid is removed from the recessed portion of the silicon wafer or when the silicon wafer is dried, with which the pattern collapse becomes difficult to occur. Additionally, the protecting film is removed by a subsequent treatment.

The acid A, in other words, at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate and decyldimethylsilyl trifluoromethanesulfonate brings about the effect of accelerating a reaction between the silicon compound A and Si element in the silicon wafer. With the presence of the acid A in the liquid chemical, it is possible to form the protecting film in a short time. Incidentally, the acid A may form a part of the protecting film.

Incidentally, the rate of forming the protecting film on the surface of the substrate, i.e. the rate at which the surface of the substrate exhibits water repellency is determined by the rate at which a component constituting the silicon compound A is bonded to a reaction site of the substrate surface. In the presence of the acid A, the component constituting the silicon compound A can be rapidly bonded to silanol group serving as the reaction site of the unevenly patterned surface of the silicon wafer, so that water repellency is sufficiently provided to the substrate surface at the time of surface treatment.

If the abundance of water in the liquid chemical is increased, the silicon compound A is hydrolyzed so as to tend to reduce the reactivity, and by extension the protecting film is made difficult to be formed. Therefore, it is preferable that the total quantity of water content in the starting material is not higher than 5000 mass ppm relative to the total quantity of the raw material. In a case where the water content exceeds 5000 mass ppm, the protecting film becomes difficult to be formed in a short time. Therefore, it is preferred that the total water content is smaller, particularly preferably not larger than 1000 mass ppm, much more preferably not larger than 500 mass ppm. Furthermore, a great abundance of water tends to reduce a storage stability of the liquid chemical, so that the water content is preferred to be smaller, preferably not larger than 200 mass ppm, much more preferably not larger than 100 mass ppm. Incidentally, the water content in the starting material of the liquid chemical may not be lower than 0.1 mass ppm.

Incidentally, when using, for example, Brønsted acid instead of the acid A, a reaction sometimes occurs between the Brønsted acid and the silicon compound A thereby decreasing the silicon compound A or reducing the reactivity of the silicon compound A. Therefore, the acid A is preferable.

Incidentally, the acid A contained in the liquid chemical of the present invention for forming the protecting film may be obtained by reaction. For instance, the acid A may be obtained by reacting a silicon compound B represented by the following general formula [2] with at least one (hereinafter, sometimes referred to as "acid B") selected from the group consisting of trifluoroacetic acid, trifluoroacetic anhydride, trifluoromethanesulfonic acid and trifluoromethanesulfonic anhydride.

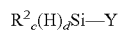

$$R^2{}_c(H)_d Si-Y \qquad [2]$$

In the formula [2], $R^2{}_c(H)_d Si-$ is $(CH_3)_3 Si-$, $(CH_3)_2(H)Si-$, $(C_4H_9)(CH_3)_2 Si-$, $(C_6H_{13})(CH_3)_2 Si-$, $(C_8H_{17})(CH_3)_2 Si-$, or $(C_{10}H_{21})(CH_3)_2 Si-$. Additionally, Y mutually independently represents a monovalent organic group of which element to be bonded to Si element is nitrogen.

The liquid chemical of the present invention for forming the protecting film may be one where the silicon compound B is added excessively relative to the acid B and where the silicon compound B not consumed by the reaction forms the protecting film by using the acid A generated by the above-mentioned reaction as a catalyst. More specifically, an excess of the silicon compound B that is not consumed by the reaction may contribute to the formation of the protecting film as the silicon compound A. Incidentally, the silicon compound B is preferably 0.2 to 100000 mole times, more preferably 0.5 to 50000 mole times, much more preferably 1 to 10000 mole times the acid B in mole ratio.

The acid A receives an electron from the silicon compound A, thereby accelerating the reaction between the silicon compound A and silanol group serving as the reaction site of the surface of the silicon wafer thereby acting as a catalyst for chemically bonding the silicon compound A to Si element in the silicon wafer through siloxane bond. The acid A is considered to act in the mechanism as shown in the upper column of the following drawing. Incidentally, in the drawing, the acid A is represented as "L". With the presence of the acid A, it becomes possible to form the protecting film in a short time. If the abundance of water in the liquid chemical is increased, the silicon compound A is hydrolyzed so as to tend to be reduced in reactivity, and by extension the protecting film is made difficult to be formed. Therefore, it is preferable that the total quantity of water content in the starting material is not higher than 5000 mass ppm relative to the total quantity of the raw material. If the water content exceeds 5000 mass ppm, the protecting film becomes difficult to be formed in a short time. Therefore, it is preferred that the total water content is smaller, particularly preferably not larger than 1000 mass ppm, much more preferably not larger than 500 mass ppm. Furthermore, a great abundance of water tends to reduce a storage stability of the liquid chemical, so that the water content is preferred to be smaller, preferably not larger than 200 mass ppm, much more preferably not larger than 100 mass ppm. Incidentally, the water content in the starting material of the liquid chemical may not be lower than 0.1 mass ppm. When using, for example, Brønsted acid instead of the acid A, it is considered that the Brønsted acid acts in the mechanism as shown in the lower column of the following drawing so that silanol group serving as the reaction site of the surface of the substrate reacts partially therewith thereby chemically bonding the silicon compound A to Si element in the silicon wafer through siloxane bond. However, Brønsted acid in the liquid chemical is reacted with the silicon compound A to reduce the silicon compound A or reduce the silicon compound A in reactivity, with which the surface of the substrate tends not to exhibit water repellency sufficiently.

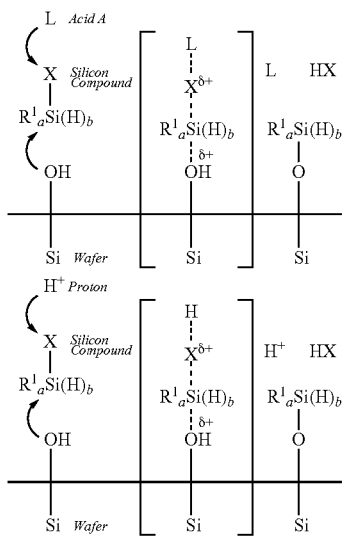

Additionally, concerning a particle measurement in a liquid phase of the liquid chemical conducted by a light-scattering type detector, it is preferable that the number of particles of larger than 0.5 μm is not more than 100 per 1 mL of the liquid chemical. If the number of particles of larger than 0.5 μm exceeds 100 per 1 mL of the liquid chemical, there arises a fear of inducing a pattern damage due to particles. This may result in reducing the device in yield and reliability and therefore not preferable. Additionally, if the number of particles of larger than 0.5 μm is not more than 100 per 1 mL of the liquid chemical, a cleaning operation to be conducted with a solvent or water after the formation of the protecting film can be omitted or shortened, and therefore preferable. Incidentally, the number of particles of larger than 0.5 μm may be more than 1 per 1 mL of the liquid chemical. Additionally, the particle measurement in the liquid phase of the liquid chemical according to the present invention is conducted by using a commercially available measurement device to which a light-scattering type measuring method for particles in liquid is applied, in which a particle diameter means a light-scattering equivalent diameter based on a PSL (a latex formed of polystyrene) standard particle.

Additionally, it is preferable that the content of each element of Na, Mg, K, Ca, Mn, Fe and Cu serving as metal impurities is not more than 100 mass ppb relative to the total quantity of the liquid chemical. All that exists in the liquid chemical in the form of metallic fine particles, ions, colloids, a complex, oxide or nitride, irrespective of whether dissolved or undissolved, is regarded as the metal impurity of the above-mentioned elements. The content of the metal impurity of exceeding 100 mass ppb relative to the total quantity of the liquid chemical brings about a fear of increasing a junction leakage current in the device thereby resulting in reducing the device in yield and reliability, and therefore not preferable. Meanwhile, the content of the metal impurity of not larger than 100 mass ppb relative to the total quantity of the liquid chemical is preferable because the cleaning operation to be conducted with a solvent or water after the formation of the protecting film can be omitted or shortened. Incidentally, the content of each of the metal impurities may be 0.01 mass ppb or more relative to the total quantity of the liquid chemical.

The liquid chemical of the present invention for forming is used in such a manner as to substitute a cleaning liquid with the liquid chemical in a process for cleaning the wafer formed having an uneven pattern. Additionally, the substituted liquid chemical may be further substituted with another cleaning liquid.

While keeping the liquid chemical substituted for the cleaning liquid as discussed above on the surface of the recessed portion, the protecting film is formed at least on the surface of the recessed portion. It is not necessary for the protecting film of the present invention to be formed continuously and evenly; however, it is preferable to form it continuously and evenly in order to impart a more excellent water repellency thereto.

The water-repellent protecting film in the present invention means a film formed on a wafer surface to reduce the wettability of the wafer surface or to impart a water-repellency to the same. In the present invention, the water-repellency means a reduction of a surface energy of the protecting film thereby weakening the interaction between water or another liquid and the surface of the protecting film (i.e., at the interface), such as hydrogen bond, intermolecular forces and the like. The effect of reducing the interaction against water is particularly outstanding, but there is also exhibited an effect of reducing the interaction against a mixture liquid of water and a liquid other than water or against a liquid other than water. With such a reduction of the interaction, the contact angle of the liquid to an article surface can be increased.

The capillary force of the surface of the recessed portion, in the present invention, is to decrease with removing the cleaning liquid from the recessed portion or drying the same, because the protecting film is formed at least on the surface of the recessed portion of the uneven pattern. With this, the pattern collapse becomes difficult to occur. Additionally, the protecting film may be removed by at least one treatment selected from irradiating the wafer surface with light, heating the wafer, exposing the wafer to ozone, and irradiating the wafer surface with plasma.

Effect of the Invention

A protecting film formed by a liquid chemical of the present invention for forming a protecting film is excellent in water repellency, and therefore reduces the capillary force of an unevenly patterned surface of a wafer, and by extension brings about a pattern collapse-preventing effect. With the use of the liquid chemical, a cleaning step conducted in a process for producing the wafer formed having a finely unevenly patterned surface is improved without lowering throughput. Accordingly, the process for producing the wafer formed having the finely unevenly patterned surface is excellent in productivity.

The liquid chemical of the present invention for forming the protecting film is adaptable to uneven patterns having aspect ratios expected to rise more and more, for example, to an aspect ratio of not less than 7, and therefore allows cost reduction in producing more sophisticated semiconductor devices. In addition to this, the liquid chemical is adaptable without considerably modifying conventional apparatuses, which results in being one applicable in production of various kinds of semiconductor devices.

THE MODE FOR CARRYING OUT THE INVENTION

Figure 1:
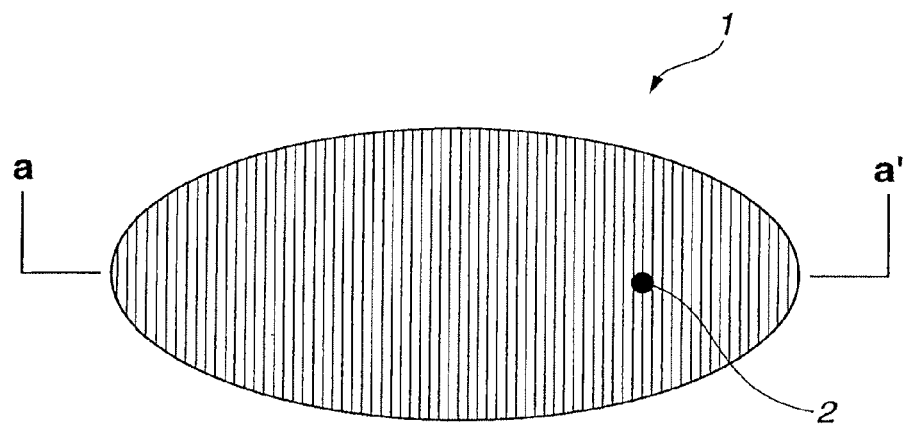
FIG. 1 A schematic plan view of a wafer 1 whose surface is made into a surface having a finely uneven pattern 2.

A preferable process for cleaning a wafer having at its surface a finely uneven pattern and containing silicon at least at a part of the uneven pattern in the use of the liquid chemical of the present invention includes:

(a step 1) a step of making a surface of a wafer into a surface having a finely uneven pattern, followed by providing a water-based cleaning liquid to the surface and retaining the water-based cleaning liquid at least on a surface of a recessed portion of the uneven pattern;

(a step 2) a step of substituting the water-based cleaning liquid retained at least on the surface of the recessed portion of the uneven pattern, with a cleaning liquid A different from the water-based cleaning liquid;

(as step 3) a step of substituting the cleaning liquid A with a liquid chemical for forming a protecting film and retaining the liquid chemical at least on the surface of the recessed portion of the uneven pattern;

(as step 4) a step of drying the surface of an unevenly patterned surface to remove the liquid therefrom; and (as step 5) a step of removing the protecting film.

Furthermore, the step (the step 4) of drying the surface of the unevenly patterned surface to remove the liquid therefrom may be performed after substituting the liquid chemical retained at least on the surface of the recessed portion of the uneven pattern with a different cleaning liquid B after the step (the step 3) of retaining the liquid chemical for forming the protecting film at least on the surface of the recessed portion of the uneven pattern. Additionally, the step (the step 4) of drying the surface of the unevenly patterned surface to remove the liquid therefrom may be performed after retaining a water-based cleaning liquid formed of a water-based solution at least on the surface of the recessed portion of the uneven pattern, through substitution with the cleaning liquid B. Additionally, the substitution with the cleaning liquid B may be omitted in a case where the liquid chemical for forming the protecting film is substitutable with the water-based cleaning liquid.

In the present invention, it is essential only that the liquid chemical or the cleaning liquid is retained at least on the surface of the recessed portion of the uneven pattern of the wafer; therefore, a cleaning style of the wafer is not particularly limited. Examples of the cleaning style of the wafer are: a sheet cleaning style represented by spin cleaning where the wafer is cleaned one by one in such a manner as to dispose the wafer generally horizontally and rotate it while supplying a liquid to the vicinity of the center of the rotation; and a batch style where a plurality of the wafer are cleaned in a cleaning bath by being immersed therein. Incidentally, the form of the liquid or the cleaning liquid at the time of supplying the liquid or the cleaning liquid at least to the surface of the recessed portion of the uneven pattern of the wafer is not particularly limited as far as it is in the form of liquid at time of being retained on the surface of the recessed portion, and may be liquid, vapor or the like, for instance.

It is preferable that a silicon compound A contained in the liquid chemical is a compound represented by the following general formula [1].

(In the formula [1], $R^1$ mutually independently represents at least one group selected from a monovalent organic group having hydrocarbon group of which carbon number is 1 to 18 and a monovalent organic group having a fluoroalkyl chain of which carbon number is 1 to 8. X mutually independently represents a monovalent organic group of which element to be bonded to Si element is nitrogen. a is an integer of from 1 to 3. b is an integer of from 0 to 2. The total of a and b is 1 to 3.)

In the general formula [1], the monovalent organic group of which element to be bonded to Si element is nitrogen element, represented by X, may include silicon element, sulfur element and a halogen element in addition to hydrogen element, carbon element, nitrogen element and oxygen element. Examples of the monovalent organic group of which element to be bonded to Si element is nitrogen element are isocyanate group, amino group, dialkylamino group, isothiocyanate group, azide group, acetamide group, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, imidazole ring (the following formula [3]), oxazolidinone ring (the following formula [4]), morpholine ring (the following formula [5]), —NH—C(O)—Si(CH$_3$)$_3$, —N(H)$_{2-g}$(Si(H)$_h$R$^3$$_{3-h}$)$_g$ (R$^3$ is a monovalent hydrocarbon group whose carbon number is 1 to 18 and whose hydrogen atoms are partially or entirely substitutable with fluorine atoms. g is an integer of 1 or 2.

h is an integer of from 0 to 2), and the like. Such a silicon compound A reacts rapidly at its reactive moiety (X) with silanol group serving as a reaction site of the unevenly patterned surface of the silicon wafer, with which the silicon compound A is chemically bonded to Si element in the silicon wafer through siloxane bond. With this, it becomes possible to coat a wafer surface with hydrophobic $R^1$ groups, thereby allowing the capillary force of the surface of the recessed portion of the wafer to decrease in a short time.

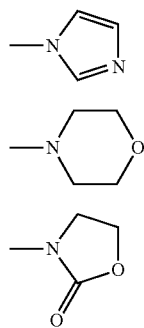

[3]

[4]

[5]

Additionally, it is preferable that the number of X of the silicon compound A, which is represented by 4-a-b, is 1 because the protecting film is evenly formed thereby.

It is preferable that $R^1$ in the general formula [1] mutually independently represents at least one group selected from $C_mH_{2m+1}$ (m=1-18) and $C_nF_{2n+1}CH_2CH_2$ (n=1 to 8), because the wettability of the unevenly patterned surface can be more reduced when the protecting film is formed thereon, i.e. because a more excellent water repellency is imparted to the surface. Additionally, it is preferable that m and n are from 1 to 8 because the protecting film can be formed in a short time on the unevenly patterned surface.

Examples of the silicon compound A represented by the general formula [1] are aminosilanes such as $CH_3Si(NH_2)_3$, $C_2H_5Si(NH_2)_3$, $C_3H_7Si(NH_2)_3$, $C_2H_5Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_2)_3$, $C_{18}H_{37}Si(NH_2)_3$, $(CH_3)_2Si(NH_2)_2$, $C_2H_5Si(CH_3)(NH_2)_2$, $(C_2H_5)_2Si(NH_2)_2$, $C_3H_7Si(CH_3)(NH_2)_2$, $(C_3H_7)_2Si(NH_2)_2$, $C_4H_9Si(CH_3)(NH_2)_2$, $(C_4H_9)_2Si(NH_2)_2$, $C_5H_{11}Si(CH_3)(NH_2)_2$, $C_6H_{13}Si(CH_3)(NH_2)_2$, $C_7H_{15}Si(CH_3)(NH_2)_2$, $C_8H_{17}Si(CH_3)(NH_2)_2$, $C_9H_{19}Si(CH_3)(NH_2)_2$, $C_{10}H_{21}Si(CH_3)(NH_2)_2$, $C_{11}H_{23}Si(CH_3)(NH_2)_2$, $C_{12}H_{25}Si(CH_3)(NH_2)_2$, $C_{13}H_{27}Si(CH_3)(NH_2)_2$, $C_{14}H_{29}Si(CH_3)(NH_2)_2$, $C_{15}H_{31}Si(CH_3)(NH_2)_2$, $C_{16}H_{33}Si(CH_3)(NH_2)_2$, $C_{17}H_{35}Si(CH_3)(NH_2)_2$, $C_{18}H_{37}Si(CH_3)(NH_2)_2$, $(CH_3)_3SiNH_2$, $C_2H_5Si(CH_3)_2NH_2$, $(C_2H_5)_2Si(CH_3)NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2NH_2$, $C_9H_{19}Si(CH_3)_2NH_2$, $C_{10}H_{21}Si(CH_3)_2NH_2$, $C_{15}H_{23}Si(CH_3)_2NH_2$, $C_{12}H_{25}Si(CH_3)_2NH_2$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si(CH_3)_2NH_2$, $C_{17}H_{35}Si(CH_3)_2NH_2$, $C_{18}H_{37}Si(CH_3)_2NH_2$, $(CH_3)_2Si(H)NH_2$, $CH_3Si(H)_2NH_2$, $(C_2H_5)_2Si(H)NH_2$, $C_2H_5Si(H)_2NH_2$, $C_2H_5Si(CH_3)(H)NH_2$, $(C_3F_7)_2Si(H)NH_2$, $C_3H_7Si(H)_2NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)(NH_2)_2$, $C_2F_5CH_2CH_2Si(CH_3)(NH_2)_2$, $C_3F_7CH_2CH_2Si(CH_3)(NH_2)_2$, $C_4F_9CH_2CH_2Si(CH_3)(NH_2)_2$, $C_5F_{11}CH_2CH_2Si(CH_3)(NH_2)_2$, $C_6F_{13}CH_2CH_2Si(CH_3)(NH_2)_2$, $C_7F_{15}CH_2CH_2Si(CH_3)(NH_2)_2$, $C_8F_{17}CH_2CH_2Si(CH_3)(NH_2)_2$, $CF_3CH_2CH_2Si(CH_3)_2NH_2$, $C_2F_5CH_2CH_2Si(CH_3)_2NH_2$, $C_3F_7CH_2CH_2Si(CH_3)_2NH_2$, $C_4F_9CH_2CH_2Si(CH_3)_2NH_2$, $C_5F_{11}CH_2CH_2Si(CH_3)_2NH_2$, $C_6F_{13}CH_2CH_2Si(CH_3)_2NH_2$, $C_7F_{15}CH_2CH_2Si(CH_3)_2NH_2$, $C_8F_{17}CH_2CH_2Si(CH_3)_2NH_2$, $CF_3CH_2CH_2Si(CH_3)(H)NH_2$ and the like; those obtained by substituting amino group of the aminosilanes with $-N=C=O$, $-N(CH_3)_2$, $-N(C_2H_5)_2$, $-N=C=S$, $-N_3$, $-NHC(O)CH_3$, $-N(CH_3)C(O)CH_3$, $-N(CH_3)C(O)CF_3$, $-N=C(CH_3)OSi(CH_3)_3$, $-N=C(CF_3)OSi(CH_3)_3$, $-NHC(O)-OSi(CH_3)_3$, $-NHC(O)-NH-Si(CH_3)_3$, imidazole ring, oxazolidinone ring, morpholine ring, $-NH-C(O)-Si(CH_3)_3$, $-N(H)_{2-g}(Si(H)_hR^3_{3-h})_g$ (where $R^3$ is a monovalent hydrocarbon group whose carbon number is 1 to 18 and whose hydrogen atoms are partially or entirely substitutable with fluorine atoms. g is an integer of 1 or 2. h is an integer of from 0 to 2)); and the like.

Among these, silicon compounds A whose X represented in the general formula [1] is $-N(CH_3)_2$, $-NH_2$, $-N(C_2H_5)_2$, $-N(CH_3)C(O)CH_3$, $-N(CH_3)C(O)CF_3$, $-NHC(O)-NH-Si(CH_3)_3$, imidazole ring, $-N=C=O$, $-NH-C(O)-Si(CH_3)_3$, or $-N(H)_{2-j}(Si(H)_jR^4_{3-j})_j$ (where $R^4$ is a monovalent hydrocarbon group whose carbon number is 1 to 8 and whose hydrogen atoms are partially or entirely substitutable with fluorine atoms. i is an integer of 1 or 2. j is an integer of from 0 to 2) are preferable.

In the liquid chemical, an acid A preferably has a concentration of from 0.01 to 50 mass % relative to the total quantity of 100 mass % of the silicon compound A. A smaller addition quantity reduces the effect of acid and therefore not preferable. An excessive addition quantity also does not improve the effect, rather than brings about a fear that the wafer surface is eroded or that the acid A remains on the surface as an impurity. In view of this, the concentration of the acid A is preferably from 0.05 to 25 mass % relative to the total quantity of 100 mass % of the silicon compound A.

Furthermore, in the liquid chemical, the silicon compound A and the acid A may be diluted with a solvent. The total addition quantity of the silicon compound A and the acid A is preferably from 0.01 to 100 mass % relative to the total quantity of 100 mass % of the liquid chemical because the protecting film can be readily and evenly formed at least on the surface of the recessed portion of the uneven pattern thereby. If less than 0.01 mass %, the effect of preventing the uneven pattern tends to be insufficient. Additionally, when the total addition quantity of the silicon compound A and the acid A is large, the cost is increased thereby. Moreover, the silicon compound A and the acid A sometimes form a solid matter as a by-product by being brought into contact with a protic solvent such as water and alcohol or by being reacted with each other; therefore, if the total addition quantity of these is large, the thus formed solid matter is increased in quantity. The solid matter can be dissolved in the liquid chemical in most cases but it increases a disadvantageous possibility of remaining on the wafer in the form of particles after drying, which makes the handling of the liquid chemical difficult. In view of the above, the total addition quantity is more preferably from 0.05 to 50 mass %, much more preferably from 0.1 to 30 mass %. Additionally, when the total addition quantity of the silicon compound A and the acid A is large, the storage stability of the liquid chemical can be readily enhanced. The total addition quantity is preferably from 0.5 to 30 mass %, more preferably from 1 to 30 mass %.

Suitably adoptable examples of the solvent sometimes used for dilution in the liquid chemical are organic solvents such as hydrocarbons, esters, ethers, ketones, halogen element-containing solvents, sulfoxide-based solvents, alcohols, derivatives of polyalcohols, nitrogen element-containing solvents and the like. Among these, the use of hydrocarbons, esters, ethers, halogen element-containing solvents, solfoxide-based solvents, and derivatives of polyalcohols having no OH group is preferable because the protecting film is formed on the surface of the uneven pattern in a short time thereby.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the derivatives of polyalcohol having no OH group are diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, diethylene glycol diethyl ether, diethylene glycol monomethyl ether acetate, diethylene glycol diacetate, triethylene glycol dimethyl ether, ethylene glycol diacetate, ethylene glycol diethyl ether, ethylene glycol dimethyl ether and the like.

Additionally, it is preferable to use a uninflammable one as the organic solvent since the liquid chemical becomes uninflammable or increases in flash point so as to reduce the risk of the liquid chemical. Most of the halogen element-containing solvents are uninflammable. A halogen element-containing uninflammable solvent can be preferably used as the uninflammable organic solvent.

In a case of providing the liquid chemical to the wafer while rotating the wafer, if the boiling point of the organic solvent is low, the water-repellent cleaning liquid tends to dry up before wetly spreading over the wafer. Additionally, in a case where the boiling point is high, the viscosity tends to increase. Therefore, it is preferable to use an organic solvent having a boiling point of from 70 to 220° C. When taking the cost or compatibility with other cleaning liquids (a facility for substitution) into account, the preferable as the solvent are diethylene glycol monoethyl ether acetate, ethylene glycol monomethyl ether acetate, propylene glycol monomethyl ether acetate, diethylene glycol dimethyl ether, diethylene glycol ethylmethyl ether, diethylene glycol diethyl ether, diethylene glycol monomethyl ether acetate, diethylene glycol diacetate, triethylene glycol dimethyl ether, ethylene glycol diacetate and ethylene glycol dimethyl ether.

Additionally, it is preferable that the total quantity of the water content in the starting material for the liquid chemical for forming the protecting film is not higher than 5000 mass ppm relative to the total quantity of the raw material. In a case where the total quantity of the water content exceeds 5000 mass ppm, the effect of the silicon compound A represented by the general formula [1] and that of the acid A are so reduced that the protecting film becomes difficult to be formed in a short time. Accordingly, the smaller the total quantity of the water content, the more preferable it is; and more particularly, it is not larger than 1000 mass ppm, much more preferably not larger than 500 mass ppm. It is therefore preferable that the silicon compound A and the acid A contained in the liquid chemical, and the solvent possibly contained in the liquid chemical are not those who have a rich water content.

Additionally, concerning a particle measurement in a liquid phase of the liquid chemical conducted by a light-scattering type detector, it is preferable that the number of particles of larger than 0.5 µm is not more than 100 per 1 mL of the liquid chemical. If the number of particles of larger than 0.5 µm exceeds 100 per 1 mL of the liquid chemical, there arises a fear of inducing a pattern damage due to particles. This may result in reducing the device in yield and reliability and therefore not preferable. Additionally, if the number of particles of larger than 0.5 µm is not more than 100 per 1 mL of the liquid chemical, a cleaning operation to be conducted with a solvent or water after the formation of the protecting film can be omitted or shortened, and therefore preferable. Accordingly, the smaller the number of particles of larger than 0.5 µm per 1 mL of the liquid chemical, the more preferable it is; and more particularly, it is not larger than 10, much more preferably not larger than 2. Furthermore, the number of particles of larger than 0.5 µm may be more than 1 per 1 mL of the liquid chemical.

Additionally, it is preferable that the content of each element of Na, Mg, K, Ca, Mn, Fe and Cu serving as metal impurities is not more than 100 mass ppb relative to the total quantity of the liquid chemical. The content of the metal impurity of exceeding 100 mass ppb relative to the total quantity of the liquid chemical brings about a fear of increasing a junction leakage current in the device thereby resulting in reducing the device in yield and reliability, and therefore not preferable. Meanwhile, the content of the metal impurity of not larger than 100 mass ppb relative to the total quantity of the liquid chemical is preferable because the cleaning operation to be conducted with a solvent or water after the formation of the protecting film can be omitted or shortened. Accordingly, the smaller the content of the metal impurity, the more preferable it is; and more particularly, each metal impurity is not larger than 1 mass ppb, much more preferably not larger than 0.1 mass ppb. Furthermore, the content of the metal impurity may be 0.01 mass ppb or more relative to the total quantity of the liquid chemical.

In a process for preparing the liquid chemical for forming the protecting film, a mixture of the silicon compound A represented by the general formula [1] and the acid A is contained in the liquid chemical, in which it is preferable to purify at least one of the silicon compound A before mixed, the acid A before mixed, and a mixture liquid after mixed. Additionally, when the liquid chemical for forming the protecting film contains the solvent, the silicon compound A before mixed and the acid A before mixed may be in a condition of a solution containing the solvent. In this case, the purification may be directed toward at least one of the silicon compound A before mixed, a solution thereof, the acid A before mixed, a solution thereof, and the mixture liquid after mixed.

The purification is conducted by using at least one removal means of: removal of water content by an adsorbent such as a molecular sieve or by distillation or the like; removal of each element of Na, Mg, K, Ca, Mn, Fe and Cu serving as the metal impurities by an ion-exchange resin, distillation or the like; and removal of a contaminant such as particles by filtration separation. In view of the reactivity of the liquid for forming the protecting film and the cleanliness of the wafer, it is preferable to remove the water content, remove the metal impurities, and remove the contaminant. The order of these removal means is not limited.

The acid A contained in the liquid chemical of the present invention for forming the protecting film may be obtained by a reaction. For example, the acid A may be obtained by reacting a silicon compound B represented by the following general formula [2] with the acid B.

$R^2_c(H)_dSi-Y_{4-c-d}$ [2]

(In the formula [2], $R^2_c(H)_dSi-$ represents $(CH_3)_3Si-$, $(CH_3)_2(H)Si-$, $(C_4H_9)(CH_3)_2Si-$, $(C_6H_{13})(CH_3)_2Si-$, $(C_8H_{17})(CH_3)_2Si-$, or $(C_{10}H_{21})(CH_3)_2Si-$. Additionally, Y mutually independently represents a monovalent organic group of which element to be bonded to Si element is nitrogen.)

Incidentally, a liquid chemical prepared by obtaining the acid A from a reaction between the silicon compound B and at least one of trifluoroacetic anhydride and trifluoromethanesulfonic anhydride, or a liquid chemical prepared by using the silicon compound A and the acid A as the starting material is preferable because excellent in stability.

In the liquid chemical of the present invention for forming the protecting film, the silicon compound B may be excessively added to the acid B and an excess of the silicon compound B that is not consumed by the reaction may contribute to the formation of the protecting film as the silicon compound A. Incidentally, the silicon compound B is preferably 0.2 to 100000 mole times, more preferably 0.5 to 50000 mole times, much more preferably 1 to 10000 mole times the acid B in mole ratio.

Incidentally, it is required only to obtain the acid A, so that a reaction other than the reaction between the silicon compound B and the acid B may be adopted.

The monovalent organic group of which element to be bonded to Si element, represented by Y of the silicon compound B of the general formula [2], may contain silicon element, sulfur element, a halogen element or the like in addition to hydrogen element, carbon element, nitrogen element and oxygen element. Examples of the monovalent organic group of which element to be bonded to Si element is nitrogen element are isocyanate group, amino group, dialkylamino group, isothiocyanate group, azide group, acetamide group, —N(CH₃)C(O)CH₃, —N(CH₃)C(O)CF₃, —N═C(CH₃)OSi(CH₃)₃, —N═C(CF₃)OSi(CH₃)₃, —NHC(O)—OSi(CH₃)₃, —NHC(O)—NH—Si(CH₃)₃, imidazole ring, oxazolidinone ring, morpholine ring, —NH—C(O)—Si(CH₃)₃, —N(H)₂₋ₚ(Si(H)_qR⁵_{3-q})_p (R⁵ is a monovalent hydrocarbon group whose carbon number is 1 to 18 and whose hydrogen atoms are partially or entirely substitutable with fluorine atoms. p is an integer of 1 or 2. q is an integer of from 0 to 2), and the like.

Examples of the silicon compound B of the general formula [2] are: aminosilanes such as (CH₃)₃SiNH₂, C₄H₉Si(CH₃)₂NH₂, C₆H₁₃Si(CH₃)₂NH₂, C₈H₁₇Si(CH₃)₂NH₂, C₁₀H₂₁Si(CH₃)₂NH₂ and (CH₃)₂Si(H)NH₂; those obtained by substituting amino group (—NH₂ group) of the above-mentioned aminosilanes with —N═C═O, —N(CH₃)₂, —N(C₂H₅)₂, —N═C═S, —N₃, —NHC(O)CH₃, —N(CH₃)C(O)CH₃, —N(CH₃)C(O)CF₃, —N═C(CH₃)OSi(CH₃)₃, —N═C(CF₃)OSi(CH₃)₃, —NHC(O)—OSi(CH₃)₃, —NHC(O)—NH—Si(CH₃)₃, imidazole ring, oxazolidinone ring, morpholine ring, —NH—C(O)—Si(CH₃)₃, —NH—Si(CH₃)₃, —NH—Si(H)(CH₃)₂, —NH—Si(CH₃)₂(C₄H₉), —NH—Si(CH₃)₂(C₆H₁₃), —NH—Si(CH₃)₂(C₈H₁₇), —NH—Si(CH₃)₂(C₁₀H₂₁) or —N—{Si(CH₃)₃}₂; and the like.

Among these, silicon compounds B whose Y represented in the general formula [2] is —N(CH₃)₂, —NH₂, —N(C₂H₅)₂, —N(CH₃)C(O)CH₃, —N(CH₃)C(O)CF₃, —NHC(O)—NH—Si(CH₃)₃, imidazole ring, —NH—C(O)—Si(CH₃)₃, —NH—Si(CH₃)₃, —NH—Si(H)(CH₃)₂, —NH—Si(CH₃)₂(C₄H₉), —NH—Si(CH₃)₂(C₆H₁₃), —NH—Si(CH₃)₂(C₈H₁₇) or —NH—Si(CH₃)₂(C₁₀H₂₁) are preferable.

For instance, when mixing hexamethyldisilazane as the silicon compound B and trifluoroacetic anhydride as the acid B, the trifluoroacetic anhydride is rapidly reacted to form trimethylsilyl trifluoroacetate as the acid A.

Additionally, for example when mixing hexamethyldisilazane as the silicon compound B and trifluoromethanesulfonic anhydride as the acid B, the trifluoromethanesulfonic anhydride is rapidly reacted to form trimethylsilyl trifluoromethanesulfonate as the acid A.

Additionally, for example when mixing tetramethyldisilazane as the silicon compound B and trifluoroacetic anhydride as the acid B, the trifluoroacetic anhydride is rapidly reacted to form dimethylsilyl trifluoroacetate as the acid A.

Additionally, for example when mixing tetramethyldisilazane as the silicon compound B and trifluoromethanesulfonic anhydride as the acid B, the trifluoromethanesulfonic anhydride is rapidly reacted to form dimethylsilyl trifluoromethanesulfonate as the acid A.

Additionally, for example when mixing 1,3-dibutyltetramethylthsilazane as the silicon compound B and trifluoroacetic anhydride as the acid B, the trifluoroacetic anhydride is rapidly reacted to form butyldimethylsilyl trifluoroacetate as the acid A.

Additionally, for example when mixing 1,3-dibutyltetramethyldisilazane as the silicon compound B and trifluoromethanesulfonic anhydride as the acid B, the trifluoromethanesulfonic anhydride is rapidly reacted to form butyldimethylsilyl trifluoromethanesulfonate as the acid A.

Additionally, for example when mixing 1,3-dihexyltetramethyldisilazane as the silicon compound B and trifluoroacetic anhydride as the acid B, the trifluoroacetic anhydride is rapidly reacted to form hexyldimethylsilyl trifluoroacetate as the acid A.

Additionally, for example when mixing 1,3-dihexyltetramethyldisilazane as the silicon compound B and trifluoromethanesulfonic anhydride as the acid B, the trifluoromethanesulfonic anhydride is rapidly reacted to form hexyldimethylsilyl trifluoromethanesulfonate as the acid A.

Additionally, for example when mixing 1,3-dioctyltetramethyldisilazane as the silicon compound B and trifluoroacetic anhydride as the acid B, the trifluoroacetic anhydride is rapidly reacted to form octyldimethylsilyl trifluoroacetate as the acid A.

Additionally, for example when mixing 1,3-dioctyltetramethyldisilazane as the silicon compound B and trifluoromethanesulfonic anhydride as the acid B, the trifluoromethanesulfonic anhydride is rapidly reacted to form octyldimethylsilyl trifluoromethanesulfonate as the acid A.

Additionally, for example when mixing octyldimethyl(dimethylamino)silane as the silicon compound B and trifluoroacetic anhydride as the acid B, the trifluoroacetic anhydride is rapidly reacted to form octyldimethylsilyl trifluoroacetate as the acid A.

Additionally, for example when mixing octyldimethyl(dimethylamino)silane as the silicon compound B and trifluoromethanesulfonic anhydride as the acid B, the trifluoromethanesulfonic anhydride is rapidly reacted to form octyldimethylsilyl trifluoromethanesulfonate as the acid A.

Additionally, for example when mixing 1,3-didecyltetramethyldisilazane as the silicon compound B and trifluoroacetic anhydride as the acid B, the trifluoroacetic anhydride is rapidly reacted to form decyldimethylsilyl trifluoroacetate as the acid A.

Additionally, for example when mixing 1,3-didecyltetramethyldisilazane as the silicon compound B and trifluoromethanesulfonic anhydride as the acid B, the trifluoromethanesulfonic anhydride is rapidly reacted to form decyldimethylsilyl trifluoromethanesulfonate as the acid A.

Additionally, also in the case of obtaining the acid A in the above-mentioned reaction, the total quantity of water content in the starting material for the liquid chemical for forming the protecting film is not higher than 5000 mass ppm relative to the total quantity of the raw material. In this case also, the smaller the water content of the raw material, the more preferable it is; and particularly, it is preferably not higher than 1000 mass ppm, much more preferably not higher than 500 mass ppm. Furthermore, a great abundance of water tends to reduce the storage stability of the liquid chemical, so that the water content is preferred to be smaller, preferably not larger than 200 mass ppm, much more preferably not larger than 100 mass ppm. Incidentally, the total quantity of the water content in the raw material may be 0.1 mass ppm or more.

Additionally, also in the case where the acid A is obtained in the above-mentioned reaction, it is preferable that the number of particles of larger than 0.5 µm (the number is obtained a particle measurement in a liquid phase of the liquid chemical conducted by the light-scattering type detector) is not more than 100 per 1 mL of the liquid chemical. If the number of particles of larger than 0.5 µm exceeds 100 per 1 mL of the liquid chemical, there arises a fear of inducing a pattern damage due to particles. This may result in reducing the device in yield and reliability and therefore not preferable. Additionally, if the number of particles of larger than 0.5 µm is not more than 100 per 1 mL of the liquid chemical, a cleaning operation to be conducted with a solvent or water after the formation of the protecting film can be omitted or shortened, and therefore preferable. Accordingly, the smaller the number of particles of larger than 0.5 µm per 1 mL of the liquid chemical, the more preferable it is; and particularly, it is preferably not larger than 10, much more preferably not larger than 2. Furthermore, the number of particles of larger than 0.5 µm may not be less than 1 per 1 mL of the liquid chemical.

Additionally, also in the case where the acid A is obtained in the above-mentioned reaction, it is preferable that the content of each element of Na, Mg, K, Ca, Mn, Fe and Cu serving as metal impurities is not more than 100 mass ppb relative to the total quantity of the liquid chemical. The content of the metal impurity of exceeding 100 mass ppb relative to the total quantity of the liquid chemical brings about a fear of increasing a junction leakage current in the device thereby resulting in reducing the device in yield and reliability, and therefore not preferable. Meanwhile, the content of the metal impurity of not larger than 100 mass ppb relative to the total quantity of the liquid chemical is preferable because the cleaning operation to be conducted with a solvent or water after the formation of the protecting film can be omitted or shortened. Therefore, the smaller the content of each of the metal impurity, the preferable it is; and particularly, it is preferably not larger than 1 mass ppb, much more preferably not larger than 0.1 mass ppm. Furthermore, the content of each of the metal impurity may be 0.01 mass ppm or more.

In a process for preparing the liquid chemical for forming the protecting film, the silicon compound B and the acid B are mixed to be reacted and contained in the liquid chemical, in which it is preferable to purify at least one of the silicon compound B before mixed, the acid B before mixed, and a mixture liquid after mixed. Additionally, when the liquid chemical for forming the protecting film contains the solvent, the silicon compound B before mixed and the acid B before mixed may be in a condition of a solution containing the solvent. In this case, the purification may be directed toward at least one of the silicon compound B before mixed, a solution thereof, the acid B before mixed, a solution thereof, and the mixture liquid after mixed. Furthermore, in a case of preparing the liquid chemical for forming the protecting film by mixing the silicon compound A and a solution thereof with the acid A obtained by the above-mentioned reaction, the purification may be directed toward at least one of the silicon compound A before mixed, a solution thereof, the acid A obtained by the reaction, a solution thereof, and the mixture liquid after mixed.

The purification is conducted by using at least one removal means of: removal of water content by an adsorbent such as a molecular sieve or by distillation or the like; removal of each element of Na, Mg, K, Ca, Mn, Fe and Cu serving as the metal impurities by an ion-exchange resin, distillation or the like; and removal of a contaminant such as particles by filtration separation. In view of the activity of the liquid for forming the protecting film and the cleanliness of the same, it is preferable to remove the water content, remove the metal impurities, and remove the contaminant. The order of these removal means is not limited.

Additionally, the liquid chemical of the present invention for forming the protecting film may contain additives or the like other than the silicon compound A, the acid A and the solvent, within a range of not impairing the object of the present invention. Examples of the additives are oxidizing agents such as hydrogen peroxide, ozone and the like, surfactants, and the like. Additionally, in a case where a part of the uneven pattern of the wafer is formed of a material that the silicon compound A cannot form the protecting film thereon, there may be added an additive which allows the material to form the protecting film thereon. Furthermore, another acid may be added for other than catalytic use.

Additionally, the liquid chemical of the present invention for forming the protecting film may be used in such a manner that the raw material stored in a condition separated into two or more is mixed before use. For example in the case of using the silicon compound A and the acid A as a part of the raw material of the liquid chemical for forming the protecting film, the silicon compound A and the acid A may be independently stored and mixed before use. In the case of using the silicon compound B and the acid B, the silicon compound B and the acid B may be independently stored and then mixed before use. Incidentally, each of the silicon compound before mixed and the acid before mixed may be in a condition of a solution. Furthermore, the silicon compound and the acid may be stored in the same solution and then mixed with the other material before use.

Additionally, as the liquid chemical of the present invention for forming the protecting film, there can be used those who contains a mixture of 76 to 99.8999 mass % of an organic solvent including at least one kind selected from the group consisting of hydrofluoroether, hydrochlorofluorocarbon, ethylene glycol monomethyl ether acetate, propylene glycol monomethyl ether acetate, diethylene glycol diethyl ether, diethylene glycol monoethyl ether acetate and triethylene glycol dimethyl ether, 0.1 to 20 mass % of a compound including at least one kind selected from the group consisting of hexamethyldisilazane, tetramethyldisilazane, 1,3-dioctyltetramethyldisilazane and octyldimethyl(dimethylamino)silane and 0.0001 to 4 mass % of acid including at least one kind selected from the group consisting of trifluoroacetic acid, trifluoroacetic anhydride, trifluoromethanesulfonic acid, trifluoromethanesulfonic anhydride, trimethylsilyl trifluoroacetate, trimethylsilyl trifluoromethanesulfonate and dimethylsilyl trifluoroacetate, or those formed only of the mixture.

In a pattern forming step in which the surface of the wafer is made into a surface having a finely uneven pattern, a resist is applied to the surface of the wafer first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, etching is conducted on the wafer. At this time, recessed portions of a resist pattern are etched selectively. Finally, the resist is stripped off thereby obtaining a wafer having a finely uneven pattern.

Examples of the wafer having at its surface a finely uneven pattern and containing silicon element at at least a part of the uneven pattern include: those on which surface a film containing silicon element such as silicon, silicon oxide, silicon nitride and the like is formed; and those who contain silicon element such as silicon, silicon oxide, silicon nitride and the like at at least a part of the unevenly patterned surface when forming the uneven pattern.

Additionally, also concerning a wafer comprised of a plurality of components including at least one selected from silicon, silicon oxide and silicon nitride, the protecting film may be formed on at least one surface selected from silicon, silicon oxide and silicon nitride. Examples of the wafer comprised of a plurality of components include: those on which surface at least one selected from silicon, silicon oxide and silicon nitride is formed; and those in which at least a part of the uneven pattern is at least one selected from silicon, silicon oxide and silicon nitride when forming the uneven pattern. Incidentally, where the protecting film is formed with the liquid chemical of the present invention is a surface of the portion containing silicon element in the uneven pattern.

Figure 2:
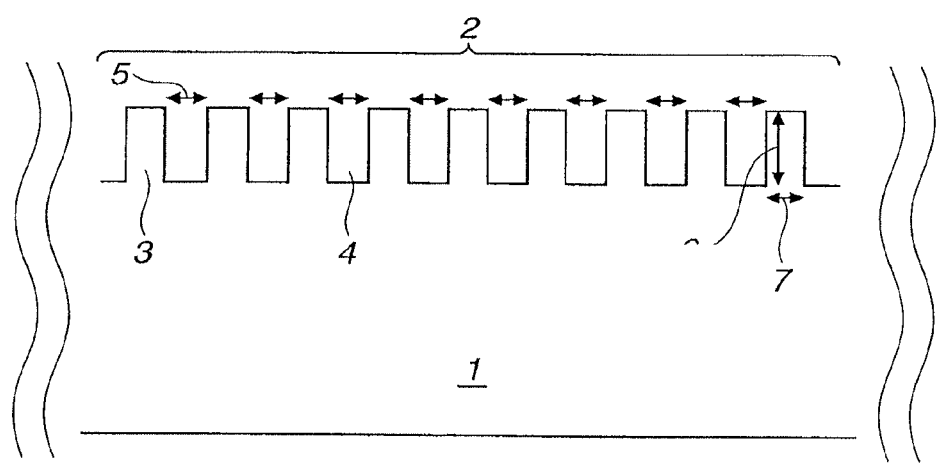
FIG. 2 A view showing a part of a-a' cross section of FIG. 1.

After making the surface of the wafer into a surface having a finely uneven pattern, cleaning of the surface is conducted by using the water-based cleaning liquid, followed by removing the water-based cleaning liquid by drying or the like. If the recessed portions have a small width and projected portions have a large aspect ratio, a pattern collapse is to easily occur. The uneven pattern is defined as shown in FIG. 1 and FIG. 2. FIG. 1 is a schematic plan view of a wafer 1 whose surface is made into a surface having a finely uneven pattern 2. FIG. 2 shows a part of an a-a' cross section in FIG. 1. Widths 5 of recessed portions are defined by an interval between a projected portion 3 and a projected portion 3, as shown in FIG. 2. The aspect ratio of projected portions is expressed by dividing heights 6 of the projected portions by widths 7 of the projected portions. The pattern collapse in the cleaning step is to easily occur when the recessed portions have widths of not more than 70 nm, particularly not more than 45 nm and when the aspect ratio is not less than 4, particularly not less than 6.

In the preferable embodiment of the present invention, the surface of the wafer is made into a surface having a finely uneven pattern, followed by providing the water-based cleaning liquid to the surface to retain the water-based cleaning liquid at least on the surface of the recessed portion, as discussed above (the step 1). Then, as discussed above (the step 2), the water-based cleaning liquid retained at least on the surface of the recessed portion is substituted with the cleaning liquid A which is different from the water-based cleaning liquid. Preferable examples of the cleaning liquid A are the liquid chemical for forming the protecting film which liquid chemical is specified by the present invention, water, organic solvents, a mixture of these, these to which at least one kind of acid, alkali, surfactant and an oxidizing agent is mixed, and the like. Additionally, in the case of using other than the liquid chemical as the cleaning liquid A, it is preferable to substitute the cleaning liquid A with the liquid chemical for forming the protecting film, under a condition where the cleaning liquid A is retained at least on the surface of the recessed portion of the uneven pattern.

Additionally, examples of the organic solvents, which is one of the preferable examples of the cleaning liquid A, include hydrocarbons, esters, ethers, ketones, halogen element-containing solvents, sulfoxide-based solvents, alcohols, derivatives of polyhydric alcohol, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3, 3-pentafluoropropane, 1,3-dichloro-1, 1,2,2,3-pentafluoropropane, 1-chloro-3,3,3-trifluoropropene, 1,2-dichloro-3,3, 3-trifuoropropene and the like; perfluoroethers; perfluoropolyethers; and the like. Examples of the sulfoxide-based solvents are dimethyl sulfoxide and the like. Examples of the alcohols are methanol, ethanol, propanol, butanol, ethylene glycol, 1,3-propanediol and the like.

Examples of the derivatives of polyhydric alcohol are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, diethylene glycol diethyl ether, diethylene glycol monomethyl ether acetate, diethylene glycol diacetate, triethylene glycol dimethyl ether, ethylene glycol diacetate, ethylene glycol diethyl ether, ethylene glycol dimethyl ether, and the like. Examples of the nitrogen element-containing solvents are formamide, N,N-dimethylformamide, N,N-dimethylacetamide, N-methyl-2-pyrrolidone, diethylamine, triethylamine, pyridine and the like.

Additionally, acid possibly contained in the cleaning liquid A is exemplified by inorganic acid and organic acid. Examples of the inorganic acid include hydrogen fluoride, buffered hydrogen fluoride, sulfuric acid, nitric acid, hydrochloric acid, phosphoric acid and the like. Examples of the organic acid include methansulfonic acid, benzenesulfonic acid, p-toluenesulfonic acid, trifluoromethanesulfonic acid, acetic acid, trifluoroacetic acid, pentafluoropropionic acid and the like. Examples of alkali possibly contained in the cleaning liquid A are ammonia, choline and the like. Examples of the oxidizing agent possibly contained in the cleaning liquid A include ozone, hydrogen peroxide and the like.

Incidentally, it is preferable that the cleaning liquid A is the organic solvent because the liquid chemical for forming the protecting film can be thereby provided to the recessed portion without contact with water. Of these, the organic solvent containing a water-soluble organic solvent (having a solubility of not lower than 5 parts by mass relative to 100 parts by mass of water) is preferable because the substitution of the water-based cleaning liquid with the cleaning liquid A is readily achieved thereby. Additionally, it is preferable that the cleaning liquid A contains an acid aqueous solution because the protecting film is formed in a short time thereby.

Moreover, a plurality of cleaning liquids may be used as the cleaning liquid A. For instance, it is possible to use, as the cleaning liquid A, two kinds i.e. a cleaning liquid containing an acid aqueous solution or an alkali aqueous solution and the organic solvent. Additionally, it is possible to clean the wafer with the cleaning liquid containing the acid aqueous solution or the alkali aqueous solution and the organic solvent in this order. Furthermore, the water-based cleaning liquid may be added, so that it is possible to clean the wafer with the cleaning liquid containing the acid aqueous solution or the alkali aqueous solution, the water-based cleaning liquid and the organic solvent, in this order.

Figure 3:
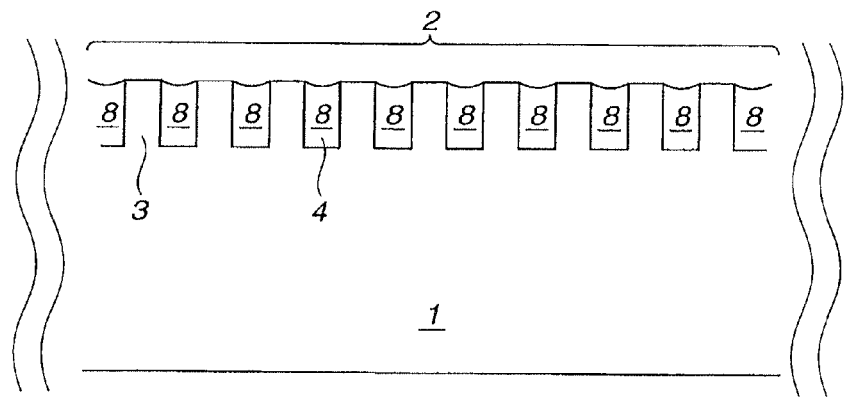
FIG. 3 A schematic view showing a liquid chemical 8 for forming a protecting film is retained in recessed portions 4 in a cleaning step.

FIG. 3 is a schematic view showing a condition where the liquid chemical 8 for forming the protecting film is retained in the recessed portions 4 in the cleaning step. The wafer of the schematic view of FIG. 3 shows a part of the a-a' cross section in FIG. 1. At the time of the cleaning step, the liquid chemical for forming the protecting film is provided onto the wafer 1 in which the uneven pattern 2 is formed. At this time, the liquid chemical is brought into a condition retained in the recessed portions 4 as shown in FIG. 3, thereby imparting water repellency to the surface.

When increasing the temperature of the liquid chemical for forming the protecting film, the protecting film can be formed in a shorter time. A temperature at which an even protecting film can be readily formed is not lower than 10° C. and lower than the boiling point of the liquid chemical; and particularly, it is preferably not lower than 15° C. and lower than a temperature 10° C. lower than the boiling point of the liquid chemical. It is preferable that the temperature of the liquid chemical is kept at the above-mentioned temperature even when the liquid chemical is retained at least on the surface of the recessed portion of the uneven pattern.

Incidentally, other cleaning liquids may be also kept at a temperature of not lower than 10° C. and lower than the boiling point of the cleaning liquid. In a case where the cleaning liquid A contains the acid aqueous solution, more preferably in a case of using a solution containing the acid aqueous solution and an organic solvent having a boiling point of not lower than 100° C., for instance, a temperature of the cleaning liquid increased to the vicinity of the boiling point of the cleaning liquid makes it easy to form the protecting film in a short time and therefore preferable.

The step (the step 4) of drying the unevenly patterned surface to remove the liquid therefrom may be performed after substituting the liquid chemical retained at least on the surface of the recessed portion of the uneven pattern the cleaning liquid B different from the liquid chemical after the step (the step 3) of retaining the liquid chemical for forming the protecting film at least on the surface of the recessed portion of the uneven pattern. Examples of the cleaning liquid B include a water-based cleaning liquid formed of a water-based solution, an organic solvent, a mixture of the water-based cleaning liquid and the organic solvent, a mixture of these into which at least one kind of acid, alkali and surfactant is mixed, those to which the silicon compound A contained in the liquid chemical for forming the protecting film and the acid A are so added as to have a lower concentration than the liquid chemical, and the like.

Additionally, examples of the organic solvent which is one of preferable examples of the cleaning liquid B are hydrocarbons, esters, ethers, ketones, halogen element-containing solvents, sulfoxide-based solvents, alcohols, derivatives of polyalcohols, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1, 1,2,2,3-pentafluoropropane, 1-chloro-3,3,3-trifluoropropene, 1,2-dichloro-3,3,3-trifuoropropene and the like; perfluoroethers;

perfluoropolyethers; and the like. Examples of the sulfoxide-based solvents are dimethyl sulfoxide and the like. Examples of the alcohols are methanol, ethanol, propanol, butanol, ethylene glycol, 1,3-propanediol and the like. Examples of the derivatives of polyhydric alcohol are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethylmethyl ether, diethylene glycol diethyl ether, diethylene glycol monomethyl ether acetate, diethylene glycol diacetate, triethylene glycol dimethyl ether, ethylene glycol diacetate, ethylene glycol diethyl ether, ethylene glycol dimethyl ether, and the like. Examples of the nitrogen element-containing solvents are formamide, N,N-dimethylformamide, N,N-dimethylacetamide, N-methyl-2-pyrrolidone, diethylamine, triethylamine, pyridine and the like.

Moreover, the step (the step 4) of drying the unevenly patterned surface to remove the liquid therefrom may be performed after retaining the water-based cleaning liquid formed of the water-based solution at least on the surface of the recessed portion of the uneven pattern, through the substitution with the cleaning liquid B.

Additionally, a plurality of cleaning liquids may be used as the cleaning liquid B. For example, the organic solvent (preferably containing a water-soluble organic solvent) and the water-based cleaning liquid, i.e. two kinds of the cleaning liquid may be used.

Examples of the water-based cleaning liquid include water or water obtained by mixing at least one kind of an organic solvent, acid and alkali, which include water as a primary component (for example, 50 mass % or more water content). Particularly when using water as the water-based cleaning liquid, the contact angle θ at least of the surface of the recessed portion of the uneven pattern provided with water repellency by the liquid chemical to the liquid is increased so as to decrease a capillary force P of the surface of the recessed portion, which is preferable because stains become hard to remain on the wafer surface after drying.

Figure 4:
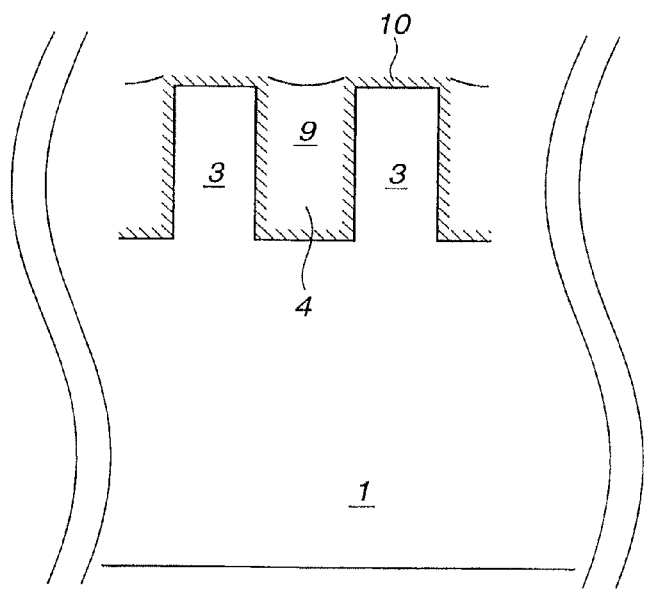
FIG. 4 A schematic view showing a condition where a water-based cleaning liquid is retained in the recessed portions 4 on which the protecting film is formed.

A schematic view showing a condition where the water-based cleaning liquid is retained in the recessed portions 4 provided with water repellency by the liquid chemical for forming the protecting film is shown in FIG. 4. The wafer as shown in the schematic view of FIG. 4 shows a part of an a-a' cross section in FIG. 1. The unevenly patterned surface is coated with a protecting film 10 by the liquid chemical, thereby being provided with water repellency. Then, the protecting film 10 is retained of the wafer surface, also when a water-based cleaning liquid 9 is removed from the unevenly patterned surface.

When the protecting film 10 is formed at least on the surface of the recessed portion of the uneven pattern of the wafer by the liquid chemical for forming the protecting film, a contact angle of from 70 to 110° on the assumption that water is retained on the surface is preferable because the pattern collapse becomes difficult to occur thereby. Additionally, the closer to 90° the contact angle is, the smaller the capillary force of the surface of the recessed portion becomes, so that the pattern collapse is made further difficult to occur. It is therefore preferable that the contact angle is from 75 to 105°. Furthermore, the capillary force is preferably not higher than 1.1 $MN/m^2$. The capillary force of not higher than 1.1 $MN/m^2$ is preferable because the pattern collapse thereby becomes difficult to occur. Additionally, a lower capillary force makes the pattern collapse further difficult to occur, so that a capillary force of not higher than 0.8 $MN/m^2$ is more preferable. Furthermore, it is ideal to put the capillary force close to 0.0 $MN/m^2$ as much as possible by adjusting the contact angle to the cleaning liquid to around 90°.

As discussed above (the step 4), the step of drying the surface of an unevenly patterned surface to remove the liquid therefrom is then performed. In the step, the liquid retained on the unevenly patterned surface is removed by drying. The drying is preferably conducted by a conventionally known drying method such as spin drying, IPA (2-propanol) steam drying, Marangoni drying, heating drying, warm air drying, vacuum drying and the like.

The liquid retained on the unevenly patterned surface when removed therefrom may be the liquid chemical, the cleaning liquid B, the water-based cleaning liquid or a mixture liquid of these. Incidentally, the mixture liquid containing the liquid chemical may be a liquid which is on the way to substitution of the liquid chemical with the cleaning liquid B, or a mixture liquid obtained by previously mixing the liquid chemical with the cleaning liquid different from the liquid chemical. Moreover, after removing the liquid retained on the unevenly patterned surface, at least one selected from the cleaning liquid B, the water-based cleaning liquid and the mixture liquid of these may be retained on the unevenly patterned surface and then dried.

As discussed above (the step 5), the step of removing the protecting film 10 is then performed. When removing the protecting film, it is effective to cleave C—C bond and C—F bond in the protecting film. A method therefor is not limited so long as it can cleave the above-mentioned bonds, and exemplified by irradiating the wafer surface with light, heating the wafer, exposing the wafer to ozone, irradiating the wafer surface with plasma, conducting corona discharge on the wafer surface, and the like.

In the case where the protecting film 10 is removed by light irradiation, it is effective to cleave C—C bond and C—F bond in the protecting film 10. In order to achieve this, it is preferable to conduct an irradiation with ultraviolet rays having a wavelength of that of shorter than 340 nm and 240 nm (corresponding to bond energies of them, i.e., 83 kcal/mol and 116 kcal/mol). As the light source therefor, there is used a metal halide lamp, a low-pressure mercury lamp, a high-pressure mercury lamp, an excimer lamp, a carbon arc or the like. When using the metal halide lamp, the intensity of the ultraviolet irradiation is preferably not less than 100 $mW/cm^2$, particularly preferably not less than 200 $mW/cm^2$, as a measurement value obtained by the illuminance meter (Intensity meter UM-10 produced by Konica Minolta Sensing, Inc., Light-Receptor UM-360 [Peak sensitivity wavelength: 365 nm, measured wavelength range: 310 to 400 nm]). Incidentally, an irradiation intensity of less than 100 $mW/cm^2$ takes a long time to remove the protecting film 10. When using the low-pressure mercury lamp, the ultraviolet irradiation is performed with shorter wavelengths so that removal of the protecting film 10 is achieved in a short time even if the intensity is low, which is preferable.

Additionally, in the case of removing the protecting film 10 by the irradiation with light, it is particularly preferable to generate ozone in parallel with decomposition of components of the protecting film 10 by ultraviolet rays and then to induce oxidation-volatilization of the components of the protecting film 10 by the ozone, since a treatment time is saved thereby. As the light source therefor, the low-pressure mercury lamp or the excimer lamp is used. Additionally, the wafer may be heated while performing light irradiation.

In the case of heating the wafer, heating of the wafer is conducted at 400 to 700° C., preferably at 500 to 700° C. The heating time therefor is preferably kept from 0.5 to 60 min, more preferably from 1 to 30 min. Additionally, this step may be conducted in combination with ozone exposure, plasma irradiation, corona discharge or the like. Additionally, the light irradiation may be conducted while heating the wafer.

In the case of exposing the wafer to ozone, it is preferable to provide ozone generated by ultraviolet irradiation using the low-pressure mercury lamp, low-temperature discharge using high voltages or the like, to the wafer surface. The wafer may be irradiated with light or heated while being exposed to ozone.

In the step of removing the protecting film 10 on the wafer surface, the protecting film 10 can be efficiently removed by combining the above-mentioned light irradiation treatment, the heating treatment, the ozone-exposure treatment, the plasma irradiation treatment and the corona discharge treatment therewith. Additionally, this step may be combined with plasma irradiation, corona discharge or the like.

The liquid chemical of the present invention may be of a one-pack type in which the silicon compound A and the acid A are mixed from the beginning, or of a two-pack type in which a solution containing the silicon compound A and a solution containing the acid A are mixed before use. Additionally, the liquid chemical may be of a two-pack type formed of: a liquid containing the silicon compound B; and a liquid containing the acid B.

EXAMPLES

To make a wafer surface into a surface having a finely uneven pattern and to substitute a cleaning liquid retained on surfaces of recessed portions with another cleaning liquid have been studied variously as discussed in conventionally known literatures and the like, and therefore techniques which have already been established. In the present invention, therefore, evaluations of a liquid chemical for forming a protecting film were mainly performed. Additionally, as apparent from the equation $$P = 2 \times \gamma \times \cos\theta / S$$

($\gamma$: Surface tension, $\theta$: Contact angle, S: Pattern width) discussed in "BACKGROUND OF THE INVENTION" and the like, a pattern collapse greatly depends on the contact angle of the cleaning liquid to the wafer surface, i.e. the contact angle of liquid drop, and on the surface tension of the cleaning liquid. In a case where a cleaning liquid is retained in recessed portions 4 of an uneven pattern 2, the contact angle of liquid drop and the capillary force of the surfaces of the recessed portions which capillary force is regarded as an equivalent of the pattern collapse are in correlation with each other, so that the capillary force may be derived from the equation and the evaluations of the contact angle of liquid drop to a protecting film 10. Incidentally, in Examples, a representative of a water-based cleaning liquid, i.e., water was used as the cleaning liquid.

However, in a case of the wafer having a finely uneven pattern at its surface, the pattern is so significantly fine that it is not possible to exactly evaluate the contact angle of the protecting film 10 formed on the unevenly patterned surface itself.

The evaluations of the contact angle of waterdrop is conducted by dropping several microliters of waterdrop on a surface of a sample (substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused and because an apparent contact angle of the waterdrop is increased under the influence of a surface shape (roughness) of the substrate upon the contact angle.

In view of this, in the present invention, various evaluations are performed by providing the liquid chemical to a wafer having a smooth surface to form the protecting film on the wafer surface and then by regarding the liquid chemical as the protecting film 10 formed on the surface of a wafer 1 at which surface a finely uneven pattern 2 is formed. Incidentally, in the present invention, a silicon wafer having on its surface a thermal oxide film layer, a silicon nitride layer or a silicon layer and having a smooth surface was used as the wafer having the smooth surface.

Details will be discussed below. Hereinafter, there will be discussed: an evaluation method for a wafer to which the liquid chemical for forming the protecting film is provided; preparation of the liquid chemical for forming the protecting film; and evaluation results after providing the liquid chemical for forming the protecting film to the wafer.

[Evaluation Method for Wafer to which Liquid Chemical for Forming Protecting Film is Provided]

As an evaluation method for the wafer to which the liquid chemical for forming the protecting film is provided, the following evaluations (1) to (4) were performed.

(1) Evaluation of Contact Angle of Protecting Film Formed on Wafer Surface

Pure water of about 2 μl was dropped on a wafer surface on which a protecting film is formed, followed by measuring an angle (contact angle) formed between the waterdrop and the wafer surface by using a contact angle meter (produced by Kyowa Interface Science Co., Ltd.: CA-X Model).

(2) Evaluation of Capillary Force

The capillary force (the absolute value of P) was obtained by calculating P by using the following equation.

$$P = 2 \times \gamma \times \cos\theta / S$$

Here, $\gamma$ represents a surface tension, $\theta$ represents a contact angle, and S represents a pattern width.

The present examples were performed on the assumption that the wafer formed to have a line-and-space pattern of which line width (the widths of the recessed portions) corresponding to a pattern width was 45 nm, as an example of a pattern shape. Incidentally, in a pattern having a line width of 45 nm, the pattern tends to collapse in a case where a cleaning liquid used when the gas-liquid interface passes through the wafer is water. In a case of 2-propanol, the pattern tends to be difficult to collapse. In a case where the pattern width is 45 nm and the wafer surface is silicon oxide, the capillary force is 0.98 MN/m$^2$ when the cleaning liquid is 2-propanol (Surface tension: 22 mN/m, Contact angle to silicon oxide: 1°). On the other hand, in a case of water (Surface tension: 72 mN/m, Contact angle to silicon oxide: 2.5°) having the largest surface tension among liquids other than mercury, the capillary force is 3.2 MN/m$^2$. It is preferable that the capillary force is not larger than 1.1 MN/m$^2$, and particularly preferably not larger than 0.8 MN/m$^2$.

(3) Removability for Protecting Film

Under the following conditions, a sample was irradiated with UV rays from a metal halide lamp for 2 hours. Those having a contact angle to waterdrop of not larger than 30° after the irradiation were determined as acceptable ones (indicated in Tables with A).

Lamp: M015-L312 produced by EYE GRAPHICS CO., LTD.
(Intensity: 1.5 kW)
Illuminance: 128 mW/cm² as a measurement value under the following conditions
Measuring Apparatus: Ultraviolet Intensity Meter (UM-10 produced by Konica Minolta Sensing, Inc.)
Light-Receptor: UM-360
(Light-Receptive Wavelength: 310-400 nm, Peak Wavelength: 365 nm)
Measuring Mode: Irradiance Measurement (4) Evaluation of Surface Smoothness of Wafer after Removing Protecting Film The surface was observed by atomic force microscope (produced by Seiko Instruments Inc.: SPI3700, 2.5 micrometer square scan), thereby obtaining the centerline average surface roughness: Ra (nm). Incidentally, Ra is a three-dimensionally enlarged one obtained by applying the centerline average roughness defined by JIS B 0601 to a measured surface and is calculated as "an average value of absolute values of difference from standard surface to designated surface" from the following equation. If the wafer has an Ra value of not higher than 1 nm after removing the protecting film, the wafer surface was considered not to be eroded and not to have a residue of the protecting film thereon and therefore determined as an acceptable one (indicated in Tables with A).

$$Ra = \frac{1}{S_0} \int_{Y_T}^{Y_B} \int_{X_L}^{X_R} |F(X, Y) - Z_0| dx dy$$

Here, $X_L$ and $X_R$, and $Y_B$ and $Y_T$ represent a measuring range in the X coordinate and the Y coordinate, respectively. $S_0$ is an area on the assumption that the measured surface is ideally flat, and is a value obtained by $(X_R-X_L) \times (Y_B-Y_T)$. Additionally, F(X,Y) represents the height at a measured point (X,Y). $Z_0$ represents the average height within the measured surface.

Example 1

(1) Preparation of Liquid Chemical for Forming Protecting Film 1 g of hexamethyldisilazane [$(H_3C)_3Si-NH-Si(CH_3)_3$] as a silicon compound A, 0.1 g of trimethylsilyl trifluoroacetate [$(CH_3)_3Si-OC(O)CF_3$] as an acid A, 98.9 g of propylene glycol monomethyl ether acetate (PGMEA) were mixed thereby obtaining a liquid chemical for forming a protecting film. Incidentally, it was confirmed that the total quantity of the water content in the starting material for the liquid chemical was not more than 5000 mass ppm relative to the total quantity of the raw material. A water content was removed from the liquid chemical by molecular sieve 4A (produced by UNION SHOWA K.K.). Thereafter, a metal impurity was removed from the liquid chemical by an ion-exchange resin (IonKleen™ SL Purifier produced by Pall Corporation), followed by removing particles from the liquid chemical by filtration separation (Optimizer produced by Nihon Entegris K.K.), thereby conducting purification. The water content in the liquid chemical after purification was measured by a Karl Fischer's moisture meter (produced by Kyoto Electronics Manufacturing Co., Ltd., ADP-511 model). As a result, the water content in the liquid chemical after purification was 6 mass ppm relative to the total quantity of the liquid chemical. Incidentally, it was also confirmed that the total quantity of water content in the starting material for the liquid chemical is not more than 5000 mass ppm relative to the total quantity of the material. Additionally, the content of a metal impurity in the liquid chemical after purification was measured by an inductively coupled plasma mass spectroscope (produced by Yokogawa Analytical Systems Inc., 7500cs model). As a result, the contents of elements of Na, Mg, K, Ca, Mn, Fe and Cu were Na=2 mass ppb, Mg=0.04 mass ppb, K=0.2 mass ppb, Ca=1 mass ppb, Mn=0.005 mass ppb, Fe=0.08 mass ppb and Cu=0.06 mass ppb, respectively. Additionally, as a particle measurement in a liquid phase of the liquid chemical conducted by light-scattering liquid-borne particles detector, the number of particles of larger than 0.5 μm was measured by a light-scattering type device for measuring particles in liquid (produced by RION Co., Ltd., KS-42AF model). As a result, the number of particles of larger than 0.5 μm was 2 per 1 mL of the liquid chemical. Also in examples later than the present example, there was used a liquid chemical confirmed by conducting a similar purification to have: a total quantity of water content in the starting material for the liquid chemical of not more than 5000 mass ppm relative to the total quantity of the material; and a water content of not higher than 5000 mass ppm relative to the total quantity of the liquid chemical; a content of each element of Na, Mg, K, Ca, Mn, Fe and Cu serving as the metal impurities of not higher than 100 mass ppb; and 100 or less particles of larger than 0.5 μm, per 1 mL of the liquid chemical.

(2) Cleaning of Silicon Wafer

A silicon wafer having a smooth thermal oxide film (a silicon wafer on which surface a thermal oxide film of 1 μm thickness was formed) was immersed in 1 mass % hydrogen fluoride aqueous solution at room temperature for 2 minutes, followed by immersing the wafer in pure water for 1 minute, and then in 2-propanol (iPA) for 1 minute.

(3) Surface Treatment on Silicon Wafer Surface with Liquid Chemical for Forming Protecting Film The silicon wafer was immersed in the liquid chemical for forming the protecting film prepared by the "(1) Preparation of liquid chemical for forming protecting film" section at 20° C. for 10 minutes. Thereafter, the silicon wafer was immersed in iPA for 1 minute and then immersed in pure water serving as a water-based liquid for 1 minute. Finally, the silicon wafer was taken out of the pure water, followed by spraying air thereon to remove the pure water from the surface.

As a result of evaluating the obtained wafer in a manner discussed in the [Evaluation method for wafer to which liquid chemical for forming protecting film is provided] section, one having had an initial contact angle of smaller than 10° before a surface treatment changed to have a contact angle of 84° after the surface treatment, as shown in Table 1, thereby exhibiting a water repellency-providing effect. Additionally, as a result of calculating the capillary force at the time of retaining water in the use of the equation shown in the "Evaluation of capillary force" section, the capillary force was so small as to be 0.3 MN/m². Additionally, the contact angle after UV irradiation was smaller than 10°, so that removal of the protecting film was achieved. Furthermore, a Ra value of the wafer after UV irradiation was smaller than 0.5 nm, with which it was confirmed that the wafer was not eroded at the time of cleaning and that residues of the liquid chemical for forming the protecting film did not remain after UV irradiation. The liquid chemical of the present invention was not changed in appearance and had a contact angle 84° even after one week of storage kept at 45° C., so that performance reduction was not confirmed.

TABLE 1

| | Liquid Chemical for forming Protecting Film | | | | | Treatment after Surface Treatment with Liquid Chemical for forming Protecting Film | | | | Evaluation Results | | | | |
|---|---|---|---|---|---|---|---|---|---|---|---|---|---|---|
| | Starting Material | | | | | | | | | | Contact Angle after Surface Treatment [°] | Capillary Force [MN/m²] <Calculated Value> | Removability of Protecting Film (Contact Angle [°]) | Surface Smoothness (Ra [nm]) |
| | Silicon Compound A | Concentration of Silicon Compound A [mass %] | Acid A | Organic Solvent | | Drying | Cleaning with Solvent | Cleaning with Water | Drying | Initial Contact Angle [°] | | | | |
| Example 1 | (H₃C)₃Si—NH—Si(CH₃)₃ | 1 | (CH₃)₃Si—OC(O)CF₃ | PGMEA | | Not Performed | Performed | Performed | Performed | <10 | 84 | 0.3 | A (<10) | A (<0.5) |
| Example 2 | (H₃C)₃Si—NH—Si(CH₃)₃ | 5 | (CH₃)₃Si—OC(O)CF₃ | PGMEA | | Not Performed | Performed | Performed | Performed | <10 | 86 | 0.2 | A (<10) | A (<0.5) |
| Example 3 | (H₃C)₃Si—NH—Si(CH₃)₃ | 10 | (CH₃)₃Si—OC(O)CF₃ | PGMEA | | Not Performed | Performed | Performed | Performed | <10 | 88 | 0.1 | A (<10) | A (<0.5) |
| Example 4 | (H₃C)₃Si—NH—Si(CH₃)₃ | 1 | (CH₃)₃Si—OC(O)CF₃ | HFE-7100 | | Not Performed | Performed | Performed | Performed | <10 | 84 | 0.3 | A (<10) | A (<0.5) |
| Example 5 | (H₃C)₃Si—NH—Si(CH₃)₃ | 5 | (CH₃)₃Si—OC(O)CF₃ | HFE-7100 | | Not Performed | Performed | Performed | Performed | <10 | 86 | 0.2 | A (<10) | A (<0.5) |
| Example 6 | (H₃C)₃Si—NH—Si(CH₃)₃ | 1 | (CH₃)₃Si—OC(O)CF₃ | HFE-7100/PGMEA | | Not Performed | Performed | Performed | Performed | <10 | 84 | 0.3 | A (<10) | A (<0.5) |
| Example 7 | (H₃C)₃Si—NH—Si(CH₃)₃ | 5 | (CH₃)₃Si—OC(O)CF₃ | HFE-7100/PGMEA | | Not Performed | Performed | Performed | Performed | <10 | 86 | 0.2 | A (<10) | A (<0.5) |
| Example 8 | (H₃C)₃Si—NH—Si(CH₃)₃ | 10 | (CH₃)₃Si—OC(O)CF₃ | HFE-7100/PGMEA | | Not Performed | Performed | Performed | Performed | <10 | 88 | 0.1 | A (<10) | A (<0.5) |
| Example 9 | (H₃C)₃Si—NH—Si(CH₃)₃ | 1 | (CH₃)₃Si—OC(O)CF₃ | CTFP | | Not Performed | Performed | Performed | Performed | <10 | 84 | 0.3 | A (<10) | A (<0.5) |
| Example 10 | (H₃C)₃Si—NH—Si(CH₃)₃ | 1 | (CH₃)₃Si—OC(O)CF₃ | CTFP/PGMEA | | Not Performed | Performed | Performed | Performed | <10 | 84 | 0.3 | A (<10) | A (<0.5) |
| Example 11 | (H₃C)₃Si—NH—Si(CH₃)₃ | 1 | (CH₃)₃Si—OC(O)CF₃ | DCTFP | | Not Performed | Performed | Performed | Performed | <10 | 84 | 0.3 | A (<10) | A (<0.5) |
| Example 12 | (H₃C)₃Si—NH—Si(CH₃)₃ | 1 | (CH₃)₃Si—OC(O)CF₃ | DCTFP/PGMEA | | Not Performed | Performed | Performed | Performed | <10 | 84 | 0.3 | A (<10) | A (<0.5) |
| Example 13 | (H₃C)₃Si—NH—Si(CH₃)₃ | 1 | (CH₃)₃Si—OS(O₂)CF₃ | HFE-7100 | | Not Performed | Performed | Performed | Performed | <10 | 80 | 0.6 | A (<10) | A (<0.5) |
| Example 14 | (H₃C)₃Si—NH—Si(CH₃)₃ | 1 | (CH₃)₃Si—OS(O₂)CF₃ | HFE-7100/PGMEA | | Not Performed | Performed | Performed | Performed | <10 | 80 | 0.6 | A (<10) | A (<0.5) |
| Example 15 | (H₃C)₃Si—NH—Si(CH₃)₃ | 1 | (CH₃)₃Si—OS(O₂)CF₃ | CTFP | | Not Performed | Performed | Performed | Performed | <10 | 80 | 0.6 | A (<10) | A (<0.5) |
| Example 16 | (H₃C)₃Si—NH—Si(CH₃)₃ | 1 | (CH₃)₃Si—OS(O₂)CF₃ | CTFP/PGMEA | | Not Performed | Performed | Performed | Performed | <10 | 80 | 0.6 | A (<10) | A (<0.5) |
| Example 17 | (H₃C)₃Si—NH—Si(CH₃)₃ | 1 | (CH₃)₃Si—OC(O)CF₃ | PGMEA | | Not Performed | Not Performed | Performed | Performed | <10 | 84 | 0.3 | A (<10) | A (<0.5) |
| Example 18 | (H₃C)₃Si—NH—Si(CH₃)₃ | 1 | (CH₃)₃Si—OC(O)CF₃ | HFE-7100/PGMEA | | Not Performed | Not Performed | Performed | Performed | <10 | 84 | 0.3 | A (<10) | A (<0.5) |
| Example 19 | (H₃C)₂Si(H)—NH—Si(H)(CH₃)₂ | 1 | (CH₃)₃Si—OC(O)CF₃ | PGMEA | | Not Performed | Not Performed | Performed | Performed | <10 | 86 | 0.2 | A (<10) | A (<0.5) |

TABLE 1-continued

| | Liquid Chemical for forming Protecting Film | | | | Treatment after Surface Treatment with Liquid Chemical for forming Protecting Film | | | | Evaluation Results | | | | |
| --- | --- | --- | --- | --- | --- | --- | --- | --- | --- | --- | --- | --- | --- |
| | Starting Material | | | | | | | | | Contact Angle after Surface Treatment [°] | | Removability of Protecting Film (Contact Angle [°]) | Surface Smoothness (Ra [nm]) |
| | Silicon Compound A | Concentration of Silicon Compound A [mass %] | Acid A | Organic Solvent | Drying | Cleaning with Solvent | Cleaning with Water | Drying | Initial Contact Angle [°] | | Capillary Force [MN/m²] <Calculated Value> | | |
| Example 20 | $(H_3CO)_2Si(H)-NH-Si(H)(CH_3)_2$ | 1 | $(CH_3)_3Si-OC(O)CF_3$ | HFE-7100/PGMEA | Not Performed | Not Performed | Performed | Performed | <10 | 86 | 0.2 | A (<10) | A (<0.5) |
| Example 21 | $(CH_3)_3Si-NH-Si(CH_3)_3$ | 1 | $(CH_3)_3Si-OC(O)CF_3$ | PGMEA | Not Performed | Not Performed | Not Performed | Performed | <10 | 84 | 0.3 | A (<10) | A (<0.5) |
| Example 22 | $(H_3CO)_2Si(H)-NH-Si(H)(CH_3)_2$ | 1 | $(CH_3)_3Si-OC(O)CF_3$ | HFE-7100/PGMEA | Not Performed | Performed | Not Performed | Performed | <10 | 84 | 0.3 | A (<10) | A (<0.5) |
| Example 23 | $(CH_3)_3Si-NH-Si(CH_3)_3$ | 1 | $(CH_3)_3Si-OC(O)CF_3$ | PGMEA | Not Performed | Performed | Not Performed | Performed | <10 | 86 | 0.2 | A (<10) | A (<0.5) |
| Example 24 | $(H_3CO)_2Si(H)-NH-Si(H)(CH_3)_2$ | 1 | $(CH_3)_3Si-OC(O)CF_3$ | HFE-7100/PGMEA | Not Performed | Not Performed | Not Performed | Performed | <10 | 86 | 0.2 | A (<10) | A (<0.5) |
| Example 25 | $(CH_3)_3Si-NH-Si(CH_3)_3$ | 1 | $(CH_3)_3Si-OC(O)CF_3$ | PGMEA | Performed | Not Performed | Not Performed | Not Performed | <10 | 84 | 0.3 | A (<10) | A (<0.5) |
| Example 26 | $(H_3CO)_2Si(H)-NH-Si(H)(CH_3)_2$ | 1 | $(CH_3)_3Si-OC(O)CF_3$ | HFE-7100/PGMEA | Performed | Not Performed | Not Performed | Not Performed | <10 | 84 | 0.3 | A (<10) | A (<0.5) |
| Example 27 | $(CH_3)_3Si-NH-Si(CH_3)_3$ | 1 | $(CH_3)_3Si-OC(O)CF_3$ | PGMEA | Performed | Not Performed | Not Performed | Not Performed | <10 | 86 | 0.2 | A (<10) | A (<0.5) |

Examples 2 to 56

The surface treatment was conducted on the wafer upon suitably modifying the conditions of Example 1, such as the silicon compound A, the concentration of the silicon compound A, the acid A, the organic solvent, the treatment procedure taken after the surface treatment with the liquid chemical for forming the protecting film and the like. Then, evaluation was performed thereon. Results of them are shown in Tables 1 and 2.

TABLE 2

| | Liquid Chemical for forming Protecting Film Starting Material | | | |
|---|---|---|---|---|
| | Silicon Compound A | Concentration of Silicon Compound A [mass %] | Acid A | Organic Solvent |
| Example 28 | $(H_3C)_2Si(H)-NH-Si(H)(CH_3)_2$ | 1 | $(CH_3)_3Si-OC(O)CF_3$ | HFE-7100/PGMEA |
| Example 29 | $(H_3C)_3Si-NH-Si(CH_3)_3$ | 1 | $(CH_3)_3Si-OC(O)CF_3$ | PGMEA |
| Example 30 | $(H_3C)_2Si(H)-NH-Si(H)(CH_3)_2$ | 1 | $(CH_3)_3Si-OC(O)CF_3$ | PGMEA |
| Example 31 | $(H_3C)_3Si-NH-Si(CH_3)_3$ | 1 | $(CH_3)_3Si-OC(O)CF_3$ | PGMEA |
| Example 32 | $(H_3C)_2Si(H)-NH-Si(H)(CH_3)_2$ | 1 | $(CH_3)_3Si-OC(O)CF_3$ | PGMEA |
| Example 33 | $(H_3C)_3Si-NH-Si(CH_3)_3$ | 1 | $(CH_3)_3Si-OC(O)CF_3$ | PGMEA |
| Example 34 | $(H_3C)_2Si(H)-NH-Si(H)(CH_3)_2$ | 1 | $(CH_3)_3Si-OC(O)CF_3$ | PGMEA |
| Example 35 | $C_6H_6Si(CH_3)_2-NH-Si(CH_3)_2C_6H_5$ | 1 | $(CH_3)_3Si-OC(O)CF_3$ | PGMEA |
| Example 36 | $C_6H_6Si(CH_3)_2-NH-Si(CH_3)_2C_6H_5$ | 1 | $(CH_3)_3Si-OC(O)CF_3$ | HFE-7100/PGMEA |
| Example 37 | $CF_3C_2H_4Si(CH_3)_2-NH-Si(CH_3)_2C_2H_4CF_3$ | 1 | $(CH_3)_3Si-OC(O)CF_3$ | PGMEA |
| Example 38 | $CF_3C_2H_4Si(CH_3)_2-NH-Si(CH_3)_2C_2H_4CF_3$ | 1 | $(CH_3)_3Si-OC(O)CF_3$ | HFE-7100/PGMEA |
| Example 39 | $(CH_3)_3Si-N(CH_3)_2$ | 1 | $(CH_3)_3Si-OC(O)CF_3$ | PGMEA |
| Example 40 | $(CH_3)_3Si-N(CH_3)_2$ | 1 | $(CH_3)_3Si-OC(O)CF_3$ | HFE-7100/PGMEA |
| Example 41 | $(CH_3)_3Si-N(CH_3)_2$ | 1 | $(CH_3)_3Si-OC(O)CF_3$ | PGMEA |
| Example 42 | $(CH_3)_3Si-N(CH_3)_2$ | 1 | $(CH_3)_3Si-OC(O)CF_3$ | HFE-7100/PGMEA |
| Example 43 | $(CH_3)_3Si-NCO$ | 1 | $(CH_3)_3Si-OC(O)CF_3$ | PGMEA |
| Example 44 | $(CH_3)_3Si-NCO$ | 1 | $(CH_3)_3Si-OC(O)CF_3$ | HFE-7100/PGMEA |
| Example 45 | Trimethylsilylimidazole | 1 | $(CH_3)_3Si-OC(O)CF_3$ | PGMEA |
| Example 46 | Trimethylsilylimidazole | 1 | $(CH_3)_3Si-OC(O)CF_3$ | HFE-7100/PGMEA |
| Example 47 | $C_4H_9Si(CH_3)_2-N(CH_3)_2$ | 1 | $(CH_3)_3Si-OC(O)CF_3$ | PGMEA |
| Example 48 | $C_4H_9Si(CH_3)_2-N(CH_3)_2$ | 1 | $(CH_3)_3Si-OC(O)CF_3$ | HFE-7100/PGMEA |
| Example 49 | $C_8H_{17}Si(CH_3)_2-N(CH_3)_2$ | 1 | $(CH_3)_3Si-OC(O)CF_3$ | PGMEA |
| Example 50 | $C_8H_{17}Si(CH_3)_2-N(CH_3)_2$ | 1 | $(CH_3)_3Si-OC(O)CF_3$ | HFE-7100/PGMEA |
| Example 51 | $(H_3C)_3Si-NH-Si(CH_3)_3$ | 1 | $(CH_3)_3Si-OC(O)CF_3$ | PGMEA |
| Example 52 | $(H_3C)_3Si-NH-Si(CH_3)_3$ | 1 | $(CH_3)_3Si-OC(O)CF_3$ | PGMEA |
| Example 53 | $(H_3C)_3Si-NH-Si(CH_3)_3$ | 1 | $(CH_3)_3Si-OC(O)CF_3$ | PGMEA |
| Example 54 | $(H_3C)_3Si-NH-Si(CH_3)_3$ | 1 | $(CH_3)_3Si-OC(O)CF_3$ | HFE-7100/PGMEA |
| Example 55 | $(H_3C)_3Si-NH-Si(CH_3)_3$ | 1 | $(CH_3)_3Si-OC(O)CF_3$ | HFE-7100/PGMEA |
| Example 56 | $(H_3C)_3Si-NH-Si(CH_3)_3$ | 1 | $(CH_3)_3Si-OC(O)CF_3$, $(CH_3)_3Si-OS(O_2)CF_3$ | PGMEA |

| | Treatment after Surface Treatment with Liquid Chemical for forming Protecting Film | | | | Initial Contact Angle [°] | Evaluation Results | | | |
|---|---|---|---|---|---|---|---|---|---|
| | Drying | Cleaning with Solvent | Cleaning with Water | Drying | | Contact Angle after Surface Treatment [°] | Capillary Force [MN/m²] <Calculated Value> | Removability of Protecting Film (Contact Angle [°]) | Surface Smoothness (Ra [nm]) |
| Example 28 | Performed | Not Performed | Not Performed | Not Performed | <10 | 86 | 0.2 | A (<10) | A (<0.5) |
| Example 29 | Performed | Not Performed | Performed | Performed | <10 | 84 | 0.3 | A (<10) | A (<0.5) |
| Example 30 | Performed | Not Performed | Performed | Performed | <10 | 86 | 0.2 | A (<10) | A (<0.5) |
| Example 31 | Performed | Performed | Not Performed | Performed | <10 | 84 | 0.3 | A (<10) | A (<0.5) |
| Example 32 | Performed | Performed | Not Performed | Performed | <10 | 86 | 0.2 | A (<10) | A (<0.5) |
| Example 33 | Performed | Performed | Performed | Performed | <10 | 84 | 0.3 | A (<10) | A (<0.5) |
| Example 34 | Performed | Performed | Performed | Performed | <10 | 86 | 0.2 | A (<10) | A (<0.5) |
| Example 35 | Not Performed | Performed | Performed | Performed | <10 | 86 | 0.2 | A (<10) | A (<0.5) |
| Example 36 | Not Performed | Performed | Performed | Performed | <10 | 86 | 0.2 | A (<10) | A (<0.5) |
| Example 37 | Not Performed | Performed | Performed | Performed | <10 | 84 | 0.3 | A (<10) | A (<0.5) |
| Example 38 | Not Performed | Performed | Performed | Performed | <10 | 84 | 0.3 | A (<10) | A (<0.5) |
| Example 39 | Not Performed | Performed | Performed | Performed | <10 | 82 | 0.4 | A (<10) | A (<0.5) |
| Example 40 | Not Performed | Performed | Performed | Performed | <10 | 82 | 0.4 | A (<10) | A (<0.5) |

TABLE 2-continued

| | | | | | | | | | |
|---|---|---|---|---|---|---|---|---|---|
| Example 41 | Not Performed | Performed | Performed | Performed | <10 | 84 | 0.3 | A (<10) | A (<0.5) |
| Example 42 | Not Performed | Performed | Performed | Performed | <10 | 84 | 0.3 | A (<10) | A (<0.5) |
| Example 43 | Not Performed | Performed | Performed | Performed | <10 | 80 | 0.6 | A (<10) | A (<0.5) |
| Example 44 | Not Performed | Performed | Performed | Performed | <10 | 80 | 0.8 | A (<10) | A (<0.5) |
| Example 45 | Not Performed | Performed | Performed | Performed | <10 | 82 | 0.4 | A (<10) | A (<0.5) |
| Example 46 | Not Performed | Performed | Performed | Performed | <10 | 82 | 0.4 | A (<10) | A (<0.5) |
| Example 47 | Not Performed | Performed | Performed | Performed | <10 | 92 | 0.1 | A (<10) | A (<0.5) |
| Example 48 | Not Performed | Performed | Performed | Performed | <10 | 92 | 0.1 | A (<10) | A (<0.5) |
| Example 49 | Not Performed | Performed | Performed | Performed | <10 | 104 | 0.8 | A (<10) | A (<0.5) |
| Example 50 | Not Performed | Performed | Performed | Performed | <10 | 104 | 0.8 | A (<10) | A (<0.5) |
| Example 51 | Not Performed | Performed | Performed | Performed | <10 | 98 | 0.1 | A (<10) | A (<0.5) |
| Example 52 | Not Performed | Performed | Performed | Performed | <10 | 80 | 0.6 | A (<10) | A (<0.5) |
| Example 53 | Not Performed | Performed | Performed | Performed | <10 | 86 | 0.2 | A (<10) | A (<0.5) |
| Example 54 | Not Performed | Performed | Performed | Performed | <10 | 80 | 0.6 | A (<10) | A (<0.5) |
| Example 55 | Not Performed | Performed | Performed | Performed | <10 | 86 | 0.2 | A (<10) | A (<0.5) |
| Example 56 | Not Performed | Performed | Performed | Performed | <10 | 84 | 0.3 | A (<10) | A (<0.5) |

In Tables, [$H_3C)_2Si(H)$—NH—Si(H)(CH$_3$)$_2$] means tetramethyldisilazane. [C$_6$H$_5$Si(CH$_3$)$_2$—NH—Si(CH$_3$)$_2$C$_6$H$_5$] means diphenyltetramethyldisilazane. [CF$_3$C$_2$H$_4$Si(CH$_3$)$_2$—NH—Si(CH$_3$)$_2$C$_2$H$_4$CF$_3$] means 1,3-bis(trifluoropropyltetramethyldisilazane. [(CH$_3$)$_3$Si—N(CH$_3$)$_2$] means trimethylsilyl dimethylamine. [(CH$_3$)$_3$Si—N(C$_2$H$_5$)$_2$] means trimethylsilyl diethylamine. [(CH$_3$)$_3$Si—NCO] means trimethylsilyl isocyanate. [C$_4$H$_9$Si(CH$_3$)$_2$—N(CH$_3$)$_2$] means butyldimethyl(dimethylamino)silane. [C$_8$H$_{17}$Si(CH$_3$)$_2$—N(CH$_3$)$_2$] means octyldimethyl(dimethylamino)silane.

Additionally, Examples 45 to 46 used trimethylsilylimidazole as shown below, as the silicon compound A contained in the liquid chemical for forming the protecting film.

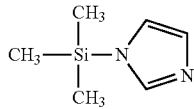

Furthermore, in Tables, [(CH$_3$)$_3$Si—OS(O$_2$)CF$_3$] means trimethylsilyl trifluoromethanesulfonate.

Moreover, in Tables, "PGMEA" means propylene glycol monomethyl ether acetate. "HFE-7100" means hydrofluoroether (HFE-7100 produced by 3M Limited). "HFE-7100/PGMEA" means a mixture solution in which HFE-7100:PGMEA is 95:5 in mass ratio. "CTFP" means 1-chloro-3,3,3-trifluoropropene. "CTFP/PGMEA" means a mixture solution in which CTFP:PGMEA is 95:5 in mass ratio. "DCTFP" means cis-1,2-dichloro-3,3,3-trifluoropropene. "DCTFP/PGMEA" means a mixture solution in which DCTFP:PGMEA is 95:5 in mass ratio.

In Example 56, trimethylsilyl trifluoroacetate and trimethylsilyl trifluoromethanesulfonate were used in a quantity of 0.05 g each as the acid A.

In Examples 17 to 20, the silicon wafer was immersed in pure water for 1 minute after being immersed in the liquid chemical for forming the protecting film in "(3) Surface treatment on silicon wafer surface with liquid chemical for forming protecting film". The silicon wafer was finally taken out of pure water, followed by spraying air thereon to remove the pure water from the surface.

In Examples 21 to 24, the silicon wafer was immersed in iPA for 1 minute after being immersed in the liquid chemical for forming the protecting film in "(3) Surface treatment on silicon wafer surface with liquid chemical for forming protecting film". The silicon wafer was finally taken out of iPA, followed by spraying air thereon to remove iPA from the surface.

In Examples 25 to 28, the silicon wafer was taken out of the liquid chemical for forming the protecting film in "(3) Surface treatment on silicon wafer surface with liquid chemical for forming protecting film", followed by spraying air thereon to remove the liquid chemical for forming the protecting film from the surface.

In Examples 29 and 30, the silicon wafer was immersed in the liquid chemical for forming the protecting film in "(3) Surface treatment on silicon wafer surface with liquid chemical for forming protecting film", followed by spraying air thereon to remove the liquid chemical for forming the protecting film from the surface. Thereafter, the silicon wafer was immersed in pure water for 1 minute and finally taken out of the pure water, followed by spraying air thereon to remove the pure water from the surface.

In Examples 31 and 32, the silicon wafer was immersed in the liquid chemical for forming the protecting film in "(3) Surface treatment on silicon wafer surface with liquid chemical for forming protecting film", followed by spraying air thereon to remove the liquid chemical for forming the protecting film from the surface. Thereafter, the silicon wafer was immersed in iPA for 1 minute and finally taken out of iPA, followed by spraying air thereon to remove iPA from the surface.

In Examples 33 and 34, the silicon wafer was immersed in the liquid chemical for forming the protecting film in "(3) Surface treatment on silicon wafer surface with liquid chemical for forming protecting film", followed by spraying air thereon to remove the liquid chemical for forming the protecting film from the surface. Thereafter, the silicon wafer was immersed in iPA for 1 minute and then in pure water for 1 minute, and finally taken out of the pure water, followed by spraying air thereon to remove the pure water from the surface.

In Example 51, the silicon wafer having the smooth thermal oxide film (a silicon wafer on which surface a thermal oxide film of 1 μm thickness was formed) was immersed in 1 mass % hydrogen fluoride aqueous solution at room temperature for 2 minutes and then in pure water for 1 minute, as discussed in "(2) Cleaning of silicon wafer". Furthermore, the silicon wafer was immersed in 0.3 mass % hydrochloric acid aqueous solution at 98° C. for 1 minute and then immersed in pure water at room temperature for 1 minute, and subsequently immersed in 2-propanol (iPA) for 1 minute. Additionally, in Examples 52 and 54, the same treatment as above was conducted by using a silicon wafer having a smooth silicon nitride film (a silicon wafer on which surface a silicon nitride film of 0.3 μm thickness was formed).

In Examples 53 and 55, a silicon wafer having a smooth silicon nitride film (a silicon wafer on which surface a silicon nitride film of 0.3 μm thickness was formed) was immersed in 1 mass % hydrogen fluoride aqueous solution at room temperature for 2 minutes and then in pure water for 1 minute, as discussed in "(2) Cleaning of silicon wafer". Furthermore, the silicon wafer was immersed in a mixture liquid in which the mass ratio of 0.6 mass % hydrochloric acid aqueous solution and ethylene glycol is 50:50, at 98° C. for 1 minute, and then immersed in pure water at room temperature for 1 minute, and subsequently immersed in 2-propanol (iPA) for 1 minute.

Example 57

The procedure was the same as Example 1 with the exception that the liquid chemical for forming the protecting film, containing trimethylsilyl trifluoroacetate as the acid A, hexamethyldisilazane as the silicon compound A and PGMEA as the organic solvent, was obtained by mixing 1 g of hexamethyldisilazane [$(H_3C)_3Si-NH-Si(CH_3)_3$] as a silicon compound B, 0.1 g of trifluoroacetic anhydride [$\{CF_3C(O)\}_2O$] as the acid B and 98.9 g of PGMEA as the organic solvent and then reacting them. Hexamethyldisilazane contained in the liquid chemical of the present example is the silicon compound B which is not consumed in the reaction for obtaining the acid A, and the components thereof are able to function as the silicon compound A. As an evaluation result, the contact angle after the surface treatment was 82° as shown in Table 3 and therefore exhibited a water repellency-providing effect. Furthermore, the capillary force when water was retained was 0.4 MN/m$^2$ and therefore low. Additionally, the contact angle after UV irradiation was smaller than 10°, so that removal of the protecting film was achieved. Furthermore, the Ra value of the wafer after UV irradiation was smaller than 0.5 nm, with which it was confirmed that the wafer was not eroded at the time of cleaning and that residues of the protecting film did not remain after UV irradiation.

TABLE 3

| | Liquid Chemical for forming Protecting Film | | | | |
|---|---|---|---|---|---|
| | Starting Material | | | | |
| | Silicon Compound B | Concentration of Silicon Compound B [mass %] | Acid B | Organic Solvent | Acid A |
| Example 57 | $(H_3C)_3Si-NH-Si(CH_3)_3$ | 1 | $[CF_3C(O)]_2O$ | PGMEA | $(CH_3)_3Si-OC(O)CF_3$ |
| Example 58 | $(H_3C)_3Si-NH-Si(CH_3)_3$ | 1 | $[CF_3C(O)]_2O$ | HFE-7100 | $(CH_3)_3Si-OC(O)CF_3$ |
| Example 59 | $(H_3C)_3Si-NH-Si(CH_3)_3$ | 1 | $[CF_3C(O)]_2O$ | HFE-7100/PGMEA | $(CH_3)_3Si-OC(O)CF_3$ |
| Example 60 | $(H_3C)_3Si-NH-Si(CH_3)_3$ | 1 | $[CF_3S(O_2)]_2O$ | HFE-7100 | $(CH_3)_3Si-OS(O_2)CF_3$ |
| Example 61 | $(H_3C)_3Si-NH-Si(CH_3)_3$ | 1 | $[CF_3S(O_2)]_2O$ | HFE-7100/PGMEA | $(CH_3)_3Si-OS(O_2)CF_3$ |
| Example 62 | $(H_3C)_3Si-NH-Si(CH_3)_3$ | 1 | $[CF_3S(O_2)]_2O$ | CTFP/PGMEA | $(CH_3)_3Si-OS(O_2)CF_3$ |
| Example 63 | $(H_3C)_2Si(H)-NH-Si(H)(CH_3)_2$ | 1 | $[CF_3C(O)]_2O$ | PGMEA | $(H_3C)_2Si(H)-OC(O)CF_3$ |
| Example 64 | $(H_3C)_2Si(H)-NH-Si(H)(CH_3)_2$ | 1 | $[CF_3C(O)]_2O$ | HFE-7100 | $(H_3C)_2Si(H)-OC(O)CF_3$ |
| Example 65 | $(H_3C)_2Si(H)-NH-Si(H)(CH_3)_2$ | 1 | $[CF_3C(O)]_2O$ | HFE-7100/PGMEA | $(H_3C)_2Si(H)-OC(O)CF_3$ |
| Example 66 | $(H_3C)_2Si(H)-NH-Si(H)(CH_3)_2$ | 1 | $[CF_3S(O_2)]_2O$ | HFE-7100 | $(H_3C)_2Si(H)-OS(O_2)CF_3$ |
| Example 67 | $(H_3C)_2Si(H)-NH-Si(H)(CH_3)_2$ | 1 | $[CF_3S(O_2)]_2O$ | HFE-7100/PGMEA | $(H_3C)_2Si(H)-OS(O_2)CF_3$ |
| Example 68 | $C_4H_9Si(CH_3)_2-NH-Si(CH_3)_2C_4H_9$ | 1 | $[CF_3C(O)]_2O$ | PGMEA | $C_4H_9Si(CH_3)_2-OC(O)CF_3$ |
| Example 69 | $C_4H_9Si(CH_3)_2-NH-Si(CH_3)_2C_4H_9$ | 1 | $[CF_3S(O_2)]_2O$ | PGMEA | $C_4H_9Si(CH_3)_2-OS(O_2)CF_3$ |
| Example 70 | $C_8H_{17}Si(CH_3)_2-NH-Si(CH_3)_2C_8H_{17}$ | 1 | $[CF_3C(O)]_2O$ | PGMEA | $C_8H_{17}Si(CH_3)_2-OC(O)CF_3$ |
| Example 71 | $C_8H_{17}Si(CH_3)_2-NH-Si(CH_3)_2C_8H_{17}$ | 1 | $[CF_3S(O_2)]_2O$ | PGMEA | $C_8H_{17}Si(CH_3)_2-OS(O_2)CF_3$ |

| | Treatment after Surface Treatment with Liquid Chemical for forming Protecting Film | | | | Evaluation Results | | | | |
|---|---|---|---|---|---|---|---|---|---|
| | Drying | Cleaning with Solvent | Cleaning with Water | Drying | Initial Contact Angle [°] | Contact Angle after Surface Treatment [°] | Capillary Force [MN/m$^2$] <Calculated Value> | Removability of Protecting Film (Contact Angle [°]) | Surface Smoothness (Ra [nm]) |
| Example 57 | Not Performed | Performed | Performed | Performed | <10 | 82 | 0.4 | A (<10) | A (<0.5) |
| Example 58 | Not Performed | Performed | Performed | Performed | <10 | 82 | 0.4 | A (<10) | A (<0.5) |
| Example 59 | Not Performed | Performed | Performed | Performed | <10 | 82 | 0.4 | A (<10) | A (<0.5) |

TABLE 3-continued

| Example | | | | | | | | | |
|---|---|---|---|---|---|---|---|---|---|
| Example 60 | Not Performed | Performed | Performed | Performed | <10 | 80 | 0.6 | A (<10) | A (<0.5) |
| Example 61 | Not Performed | Performed | Performed | Performed | <10 | 80 | 0.6 | A (<10) | A (<0.5) |
| Example 62 | Not Performed | Performed | Performed | Performed | <10 | 80 | 0.6 | A (<10) | A (<0.5) |
| Example 63 | Not Performed | Performed | Performed | Performed | <10 | 86 | 0.2 | A (<10) | A (<0.5) |
| Example 64 | Not Performed | Performed | Performed | Performed | <10 | 86 | 0.2 | A (<10) | A (<0.5) |
| Example 65 | Not Performed | Performed | Performed | Performed | <10 | 86 | 0.2 | A (<10) | A (<0.5) |
| Example 66 | Not Performed | Performed | Performed | Performed | <10 | 82 | 0.4 | A (<10) | A (<0.5) |
| Example 67 | Not Performed | Performed | Performed | Performed | <10 | 82 | 0.4 | A (<10) | A (<0.5) |
| Example 68 | Not Performed | Performed | Performed | Performed | <10 | 90 | 0.0 | A (<10) | A (<0.5) |
| Example 69 | Not Performed | Performed | Performed | Performed | <10 | 88 | 0.1 | A (<10) | A (<0.5) |
| Example 70 | Not Performed | Performed | Performed | Performed | <10 | 100 | 0.6 | A (<10) | A (<0.5) |
| Example 71 | Not Performed | Performed | Performed | Performed | <10 | 98 | 0.4 | A (<10) | A (<0.5) |

Examples 58 to 71

The surface treatment was conducted on the wafer upon suitably modifying the conditions of Example 57, such as the silicon compound B, the acid B, the organic solvent and the like. Then, evaluation was performed thereon. Results of them are shown in Table 3.

Incidentally, in Table, [$C_4H_9Si(CH_3)_2$—NH—$Si(CH_3)_2C_4H_9$] means 1,3-dibutyltetramethyldisilazane. [$C_8H_{17}Si(CH_3)_2$—NH—$Si(CH_3)_2C_8H_{17}$] means 1,3-dioctyltetramethyldisilazane.

Moreover, in Table, [$\{CF_3S(O_2)\}_2O$] means trifluoromethanesulfonic anhydride.

Incidentally, in Examples 58 and 59, trifluoroacetic anhydride used as the acid B was mixed with hexamethyldisilazane serving as the silicon compound B and rapidly reacted therewith, thereby changing into trimethylsilyl trifluoroacetate. Therefore, the present examples mean the same as the case of using trimethylsilyl trifluoroacetate as the acid A.

Additionally, in Examples 60 to 62, trifluoromethanesulfonic anhydride used as the acid B was mixed with hexamethyldisilazane serving as the silicon compound B and rapidly reacted therewith, thereby changing into trimethylsilyl trifluoromethanesulfonate. Therefore, the present examples mean the same as the case of using trimethylsilyl trifluoromethanesulfonate as the acid A.

Incidentally, in Examples 63 to 65, trifluoroacetic anhydride used as the acid B was mixed with tetramethyldisilazane serving as the silicon compound B and rapidly reacted therewith, thereby changing into dimethylsilyl trifluoroacetate. Therefore, the present examples mean the same as the case of using dimethylsilyl trifluoroacetate as the acid A.

Additionally, in Examples 66 and 67, trifluoromethanesulfonic anhydride used as the acid B was mixed with tetramethyldisilazane serving as the silicon compound B and rapidly reacted therewith, thereby changing into dimethylsilyl trifluoromethanesulfonate. Therefore, the present examples mean the same as the case of using dimethylsilyl trifluoromethanesulfonate as the acid A.

Incidentally, in Example 68, trifluoroacetic anhydride used as the acid B was mixed with 1,3-dibutyltetramethyldisilazane serving as the silicon compound B and rapidly reacted therewith, thereby changing into butyldimethylsilyl trifluoroacetate. Therefore, the present example means the same as the case of using butyldimethylsilyl trifluoroacetate as the acid A.

Additionally, in Example 69, trifluoromethanesulfonic anhydride used as the acid B was mixed with 1,3-dibutyltetramethyldisilazane serving as the silicon compound B and rapidly reacted therewith, thereby changing into butyldimethylsilyl trifluoromethanesulfonate. Therefore, the present example means the same as the case of using butyldimethylsilyl trifluoromethanesulfonate as the acid A.

Additionally, in Example 70, trifluoroacetic anhydride used as the acid B was mixed with 1,3-dioctyltetramethyldisilazane serving as the silicon compound B and rapidly reacted therewith, thereby changing into octyldimethylsilyl trifluoroacetate. Therefore, the present example means the same as the case of using octyldimethylsilyl trifluoroacetate as the acid A.

Additionally, in Example 71, trifluoromethanesulfonic anhydride used as the acid B was mixed with 1,3-dioctyltetramethyldisilazane serving as the silicon compound B and rapidly reacted therewith, thereby changing into octyldimethylsilyl trifluoromethanesulfonate. Therefore, the present example means the same as the case of using octyldimethylsilyl trifluoromethanesulfonate as the acid A.

Example 72

The procedure was the same as Example 1 with the exception that the liquid chemical for forming the protecting film, containing trimethylsilyl trifluoroacetate as the acid A, hexamethyldisilazane as the silicon compound A and PGMEA as the organic solvent, was obtained by mixing 1 g of hexamethyldisilazane [$(H_3C)_3Si$—NH—$Si(CH_3)_3$] as the silicon compound B, 0.1 g of trifluoroacetic acid [$CF_3C(O)$—OH] as the acid B and 98.9 g of PGMEA as the organic solvent and then reacting them as shown in the following formula. Hexamethyldisilazane contained in the liquid chemical of the present example is the silicon compound B which is not consumed in the reaction for obtaining the acid A, and the components thereof are able to function as the silicon compound A. As an evaluation result, the contact angle after the surface treatment was 84° as shown in Table 4 and therefore exhibited the water repellency-providing effect. Furthermore, the capillary force when water was retained was 0.3 MN/m² and therefore low. Additionally, the contact angle after UV irradiation was smaller than 10°, so that removal of the protecting film was achieved. Furthermore, the Ra value of the wafer after UV irradiation was smaller than 0.5 nm, with which it was confirmed that the wafer was not eroded at the time of cleaning and that residues of the protecting film did not remain after UV irradiation.

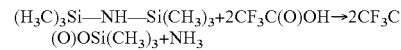

TABLE 4

| | Liquid Chemical for forming Protecting Film | | | | |
|---|---|---|---|---|---|
| | Starting Material | | | | |
| | Silicon Compound B | Concentration of Silicon Compound A [mass %] | Acid B | Organic Solvent | Acid A |
| Example 72 | $(H_3C)_3Si—NH—Si(CH_3)_3$ | 1 | $CF_3C(O)—OH$ | PGMEA | $(CH_3)_3Si—OC(O)CF_3$ |
| Example 73 | $(H_3C)_3Si—NH—Si(CH_3)_3$ | 1 | $CF_3C(O)—OH$ | HFE-7100/PGMEA | $(CH_3)_3Si—OC(O)CF_3$ |
| Example 74 | $(H_3C)_3Si—NH—Si(CH_3)_3$ | 1 | $CF_3C(O)—OH$ | CTFP/PGMEA | $(CH_3)_3Si—OC(O)CF_3$ |
| Example 75 | $(H_3C)_3Si—NH—Si(CH_3)_3$ | 1 | $CF_3C(O)—OH$ | DCTFP/PGMEA | $(CH_3)_3Si—OC(O)CF_3$ |
| Example 76 | $(H_3C)_3Si—NH—Si(CH_3)_3$ | 1 | $CF_3S(O_2)—OH$ | HFE-7100 | $(CH_3)_3Si—OS(O_2)CF_3$ |
| Example 77 | $(H_3C)_3Si—NH—Si(CH_3)_3$ | 1 | $CF_3S(O_2)—OH$ | CTFP/PGMEA | $(CH_3)_3Si—OS(O_2)CF_3$ |
| Example 78 | $(H_3C)_2Si(H)—NH—Si(H)(CH_3)_2$ | 1 | $CF_3C(O)—OH$ | PGMEA | $(CH_3)_2Si(H)—OC(O)CF_3$ |
| Example 79 | $(H_3C)_2Si(H)—NH—Si(H)(CH_3)_2$ | 10 | $CF_3C(O)—OH$ | PGMEA | $(CH_3)_2Si(H)—OC(O)CF_3$ |
| Example 80 | $(H_3C)_2Si(H)—NH—Si(H)(CH_3)_2$ | 1 | $CF_3C(O)—OH$ | HFE-7100 | $(CH_3)_2Si(H)—OC(O)CF_3$ |
| Example 81 | $(H_3C)_2Si(H)—NH—Si(H)(CH_3)_2$ | 10 | $CF_3C(O)—OH$ | HFE-7100 | $(CH_3)_2Si(H)—OC(O)CF_3$ |
| Example 82 | $(H_3C)_2Si(H)—NH—Si(H)(CH_3)_2$ | 1 | $CF_3C(O)—OH$ | HFE-7100/PGMEA | $(CH_3)_2Si(H)—OC(O)CF_3$ |
| Example 83 | $(H_3C)_2Si(H)—NH—Si(H)(CH_3)_2$ | 10 | $CF_3C(O)—OH$ | HFE-7100/PGMEA | $(CH_3)_2Si(H)—OC(O)CF_3$ |
| Example 84 | $(H_3C)_2Si(H)—NH—Si(H)(CH_3)_2$ | 1 | $CF_3S(O_2)—OH$ | HFE-7100 | $(CH_3)_2Si(H)—OC(O)CF_3$ |
| Example 85 | $(H_3C)_2Si(H)—NH—Si(H)(CH_3)_2$ | 1 | $CF_3S(O_2)—OH$ | HFE-7100/PGMEA | $(CH_3)_2Si(H)—OC(O)CF_3$ |
| Example 86 | $(CH_3)_3Si—N(CH_3)_2$ | 1 | $CF_3C(O)—OH$ | PGMEA | $(CH_3)_3Si—OC(O)CF_3$ |
| Example 87 | $(CH_3)_3Si—N(CH_3)_2$ | 1 | $CF_3C(O)—OH$ | HFE-7100/PGMEA | $(CH_3)_3Si—OC(O)CF_3$ |
| Example 88 | $(CH_3)_3Si—N(C_2H_5)_2$ | 1 | $CF_3C(O)—OH$ | PGMEA | $(CH_3)_3Si—OC(O)CF_3$ |
| Example 89 | $(CH_3)_3Si—N(C_2H_5)_2$ | 1 | $CF_3C(O)—OH$ | HFE-7100/PGMEA | $(CH_3)_3Si—OC(O)CF_3$ |
| Example 90 | $C_4H_9Si(CH_3)_2—N(CH_3)_2$ | 1 | $CF_3C(O)—OH$ | PGMEA | $C_4H_9Si(CH_3)_2—OC(O)CF_3$ |
| Example 91 | $C_4H_9Si(CH_3)_2—N(CH_3)_2$ | 1 | $CF_3C(O)—OH$ | HFE-7100/PGMEA | $C_4H_9Si(CH_3)_2—OC(O)CF_3$ |
| Example 92 | $C_8H_{17}Si(CH_3)_2—N(CH_3)_2$ | 1 | $CF_3C(O)—OH$ | PGMEA | $C_8H_{17}Si(CH_3)_2—OC(O)CF_3$ |
| Example 93 | $C_8H_{17}Si(CH_3)_2—N(CH_3)_2$ | 1 | $CF_3C(O)—OH$ | HFE-7100/PGMEA | $C_8H_{17}Si(CH_3)_2—OC(O)CF_3$ |
| Example 94 | $(CH_3)_3Si—N(CH_3)_2$ | 1 | $CF_3S(O_2)—OH$ | PGMEA | $(CH_3)_3Si—OS(O_2)CF_3$ |
| Example 95 | $C_4H_9Si(CH_3)_2—N(CH_3)_2$ | 1 | $CF_3S(O_2)—OH$ | PGMEA | $C_4H_9Si(CH_3)_2—OS(O_2)CF_3$ |
| Example 96 | $C_8H_{17}Si(CH_3)_2—N(CH_3)_2$ | 1 | $CF_3S(O_2)—OH$ | PGMEA | $C_8H_{17}Si(CH_3)_2—OS(O_2)CF_3$ |
| Example 97 | $(H_3C)_3Si—NH—Si(CH_3)_3$ | 1 | $CF_3C(O)—OH$ | PGMEA | $(CH_3)_3Si—OC(O)CF_3$ |
| Example 98 | $(H_3C)_3Si—NH—Si(CH_3)_3$ | 1 | $CF_3C(O)—OH$ | PGMEA | $(CH_3)_3Si—OC(O)CF_3$ |
| Example 99 | $(H_3C)_3Si—NH—Si(CH_3)_3$ | 1 | $CF_3C(O)—OH$ | PGMEA | $(CH_3)_3Si—OC(O)CF_3$ |
| Example 100 | $(H_3C)_3Si—NH—Si(CH_3)_3$ | 1 | $CF_3C(O)—OH$ | HFE-7100/PGMEA | $(CH_3)_3Si—OC(O)CF_3$ |
| Example 101 | $(H_3C)_3Si—NH—Si(CH_3)_3$ | 1 | $CF_3C(O)—OH$ | HFE-7100/PGMEA | $(CH_3)_3Si—OC(O)CF_3$ |
| Example 102 | $(H_3C)_3Si—NH—Si(CH_3)_3$ | 1 | $CF_3C(O)—OH$ | PGMEA | $(CH_3)_3Si—OC(O)CF_3$ |
| Example 103 | $(H_3C)_3Si—NH—Si(CH_3)_3$ | 1 | $CF_3C(O)—OH$ | PGMEA | $(CH_3)_3Si—OC(O)CF_3$ |

| | Treatment after Surface Treatment with Liquid Chemical for forming Protecting Film | | | | Evaluation Results | | | |
|---|---|---|---|---|---|---|---|---|
| | Drying | Cleaning with Solvent | Cleaning with Water | Drying | Initial Contact Angle [°] | Contact Angle after Surface Treatment [°] | Capillary Force [MN/m²] <Calculated Value> | Removability of Protecting Film (Contact Angle [°]) | Surface Smoothness (Ra [nm]) |
| Example 72 | Not Performed | Performed | Performed | Performed | <10 | 84 | 0.3 | A (<10) | A (<0.5) |
| Example 73 | Not Performed | Performed | Performed | Performed | <10 | 84 | 0.3 | A (<10) | A (<0.5) |
| Example 74 | Not Performed | Performed | Performed | Performed | <10 | 84 | 0.3 | A (<10) | A (<0.5) |
| Example 75 | Not Performed | Performed | Performed | Performed | <10 | 84 | 0.3 | A (<10) | A (<0.5) |

TABLE 4-continued

| | | | | | | | | | |
|---|---|---|---|---|---|---|---|---|---|
| Example 76 | Not Performed | Performed | Performed | Performed | <10 | 80 | 0.6 | A (<10) | A (<0.5) |
| Example 77 | Not Performed | Performed | Performed | Performed | <10 | 80 | 0.6 | A (<10) | A (<0.5) |
| Example 78 | Not Performed | Performed | Performed | Performed | <10 | 86 | 0.2 | A (<10) | A (<0.5) |
| Example 79 | Not Performed | Performed | Performed | Performed | <10 | 88 | 0.1 | A (<10) | A (<0.5) |
| Example 80 | Not Performed | Performed | Performed | Performed | <10 | 86 | 0.2 | A (<10) | A (<0.5) |
| Example 81 | Not Performed | Performed | Performed | Performed | <10 | 88 | 0.1 | A (<10) | A (<0.5) |
| Example 82 | Not Performed | Performed | Performed | Performed | <10 | 86 | 0.2 | A (<10) | A (<0.5) |
| Example 83 | Not Performed | Performed | Performed | Performed | <10 | 88 | 0.1 | A (<10) | A (<0.5) |
| Example 84 | Not Performed | Performed | Performed | Performed | <10 | 84 | 0.3 | A (<10) | A (<0.5) |
| Example 85 | Not Performed | Performed | Performed | Performed | <10 | 84 | 0.3 | A (<10) | A (<0.5) |
| Example 86 | Not Performed | Performed | Performed | Performed | <10 | 84 | 0.3 | A (<10) | A (<0.5) |
| Example 87 | Not Performed | Performed | Performed | Performed | <10 | 84 | 0.3 | A (<10) | A (<0.5) |
| Example 88 | Not Performed | Performed | Performed | Performed | <10 | 80 | 0.6 | A (<10) | A (<0.5) |
| Example 89 | Not Performed | Performed | Performed | Performed | <10 | 80 | 0.6 | A (<10) | A (<0.5) |
| Example 90 | Not Performed | Performed | Performed | Performed | <10 | 92 | 0.1 | A (<10) | A (<0.5) |
| Example 91 | Not Performed | Performed | Performed | Performed | <10 | 92 | 0.1 | A (<10) | A (<0.5) |
| Example 92 | Not Performed | Performed | Performed | Performed | <10 | 104 | 0.8 | A (<10) | A (<0.5) |
| Example 93 | Not Performed | Performed | Performed | Performed | <10 | 104 | 0.8 | A (<10) | A (<0.5) |
| Example 94 | Not Performed | Performed | Performed | Performed | <10 | 86 | 0.2 | A (<10) | A (<0.5) |
| Example 95 | Not Performed | Performed | Performed | Performed | <10 | 94 | 0.2 | A (<10) | A (<0.5) |
| Example 96 | Not Performed | Performed | Performed | Performed | <10 | 104 | 0.8 | A (<10) | A (<0.5) |
| Example 97 | Not Performed | Performed | Performed | Performed | <10 | 86 | 0.2 | A (<10) | A (<0.5) |
| Example 98 | Not Performed | Performed | Performed | Performed | <10 | 78 | 0.7 | A (<10) | A (<0.5) |
| Example 99 | Not Performed | Performed | Performed | Performed | <10 | 84 | 0.3 | A (<10) | A (<0.5) |
| Example 100 | Not Performed | Performed | Performed | Performed | <10 | 78 | 0.7 | A (<10) | A (<0.5) |
| Example 101 | Not Performed | Performed | Performed | Performed | <10 | 84 | 0.3 | A (<10) | A (<0.5) |
| Example 102 | Not Performed | Performed | Performed | Performed | 30 | 80 | 0.6 | A (<10) | A (<0.5) |
| Example 103 | Not Performed | Performed | Performed | Performed | 20 | 84 | 0.3 | A (<10) | A (<0.5) |

Examples 73 to 103

The surface treatment was conducted on the wafer upon suitably modifying the conditions of Example 72, such as the silicon compound B, the concentration of the silicon compound B, the acid B, the organic solvent and the like. Then, evaluation was performed thereon. Results of them are shown in Tables 4.

Furthermore, in Table, [CF$_3$C(O)—OH] means trifluoroacetic acid. [CF$_3$S(O$_2$)—OH] means trifluoromethanesulfonic acid.

In Example 78, the liquid chemical for forming the protecting film, containing dimethylsilyl trifluoroacetate as the acid A and tetramethyldisilazane as the silicon compound A, was obtained by the following reaction. Tetramethyldisilazane contained in the liquid chemical of the present example is the silicon compound B which is not consumed in the reaction for obtaining the acid A, and the components thereof are able to function as the silicon compound A.

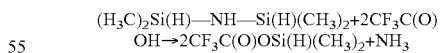

In Example 86, the liquid chemical for forming the protecting film, containing trimethylsilyl trifluoroacetate as the acid A and trimethylsilyl dimethylamine as the silicon compound A, was obtained by the following reaction. Trimethylsilyl dimethylamine contained in the liquid chemical of the present example is the silicon compound B which is not consumed in the reaction for obtaining the acid A, and the components thereof are able to function as the silicon compound A.

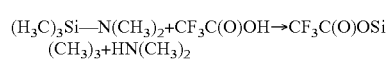

In Example 88, the liquid chemical for forming the protecting film, containing trimethylsilyl trifluoroacetate as the acid A and trimethylsilyl diethylamine as the silicon compound A, was obtained by the following reaction. Trimethylsilyl diethylamine contained in the liquid chemical of the present example is the silicon compound B which is not consumed in the reaction for obtaining the acid A, and the components thereof are able to function as the silicon compound A.

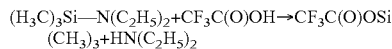

In Example 90, the liquid chemical for forming the protecting film, containing butyldimethylsilyl trifluoroacetate as the acid A and butyldimethyl(dimethylamino)silane as the silicon compound A, was obtained by the following reaction. Butyldimethyl(dimethylamino)silane contained in the liquid chemical of the present example is the silicon compound B which is not consumed in the reaction for obtaining the acid A, and the components thereof are able to function as the silicon compound A.

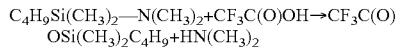

In Example 92, the liquid chemical for forming the protecting film, containing octyldimethylsilyl trifluoroacetate as the acid A and octyldimethyl(dimethylamino)silane as the silicon compound A, was obtained by the following reaction. Octyldimethyl(dimethylamino)silane contained in the liquid chemical of the present example is the silicon compound B which is not consumed in the reaction for obtaining the acid A, and the components thereof are able to function as the silicon compound A.

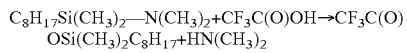

In Example 97, the silicon wafer having the smooth thermal oxide film (a silicon wafer on which surface a thermal oxide film layer of 1 μm thickness was formed) was immersed in 1 mass % hydrogen fluoride aqueous solution at room temperature for 2 minutes and then in pure water for 1 minute, as discussed in "(2) Cleaning of silicon wafer". Furthermore, the silicon wafer was immersed in 0.3 mass % hydrochloric acid aqueous solution at 98° C. for 1 minute and then immersed in pure water at room temperature for 1 minute, and subsequently immersed in 2-propanol (iPA) for 1 minute. Additionally, in Examples 98 and 100, the same treatment as above was conducted by using a silicon wafer having a smooth silicon nitride film (a silicon wafer on which surface a silicon nitride layer of 0.3 μm thickness was formed). Furthermore, in Example 102, the same treatment as above was conducted by using a silicon wafer having a smooth polysilicon film (a silicon wafer on which surface a polysilicon layer of 0.3 μm thickness was formed).

In Example 99 and in Example 101, the silicon wafer having the smooth silicon nitride film (a silicon wafer on which surface a silicon nitride layer of 0.3 μm thickness was formed) was immersed in 1 mass % hydrogen fluoride aqueous solution at room temperature for 2 minutes and then in pure water for 1 minute, as discussed in "(2) Cleaning of silicon wafer". Furthermore, the silicon wafer was immersed in a mixture liquid in which the mass ratio of 0.6 mass % hydrochloric acid aqueous solution and ethylene glycol was 50:50, at 98° C. for 1 minute, and then immersed in pure water at room temperature for 1 minute, and subsequently immersed in 2-propanol (iPA) for 1 minute. Additionally, in Example 103, the same treatment as above was conducted by using the silicon wafer having a smooth polysilicon film (a silicon wafer on which surface a polysilicon layer of 0.3 μm thickness was formed).

Example 104

The procedure was the same as Example 1 with the exception that the liquid chemical for forming the protecting film was obtained by mixing 1 g of hexamethyldisilazane [(H$_3$C)$_3$Si—NH—Si(CH$_3$)$_3$], 1 g of trifluoroacetic acid [CF$_3$C(O)OH] as the acid B and 98 g of PGMEA as the organic solvent. As an evaluation result, the contact angle after the surface treatment was 84° and therefore exhibited a water repellency-providing effect. Furthermore, the capillary force when water was retained was 0.3 MN/m$^2$ and therefore low. Additionally, the contact angle after UV irradiation was smaller than 10°, so that removal of the protecting film was achieved. Furthermore, the Ra value of the wafer after UV irradiation was smaller than 0.5 nm, with which it was confirmed that the wafer was not eroded at the time of cleaning and that residues of the protecting film did not remain after UV irradiation.

However, the contact angle after the surface treatment was 10° in the use of the liquid chemical that underwent one week of storage kept at 45° C. The reason therefor is considered that trifluoroacetic acid is so reacted with hexamethyldisilazane that hexamethyldisilazane was consumed. Incidentally, the liquid chemical of Example 1 in which the acid A was used as the starting material that underwent one week of storage kept at 45° C. had a contact angle of 84° after the surface treatment and did not exhibit performance reduction. Therefore, the liquid chemical prepared by using the silicon compound A and the acid A as the starting materials is more preferable because it is superior in stability for the liquid chemical.

Example 105

The procedure was the same as Example 1 with the exception of the treatment as shown below. The silicon wafer having the smooth thermal oxide film (a silicon wafer on which surface a thermal oxide film layer of 1 μm thickness was formed) was immersed in 1 mass % hydrogen fluoride aqueous solution at room temperature for 2 minutes and then in pure water for 1 minute, as discussed in "(2) Cleaning of silicon wafer". Furthermore, the silicon wafer wetted with water was disposed in a spin coater. While rotating the silicon wafer at 1000 rpm, 2-propanol (iPA) was supplied to the wafer surface for 1 minute. Thereafter, supply of the liquid chemical for forming the protecting film of 10 minutes, that of iPA of 1 minute, and then that of pure water of 1 minute were performed. Finally, rotation was continued for 1 minute without any supply, thereby removing pure water from the surface. As an evaluation result, the contact angle after the surface treatment was 82° and therefore exhibited the water repellency-providing effect. Furthermore, the capillary force when water was retained was 0.4 MN/m$^2$ and therefore low. Additionally, the contact angle after UV irradiation was smaller than 10°, so that removal of the protecting film was achieved. Furthermore, the Ra value of the wafer after UV irradiation was smaller than 0.5 nm, with which it was confirmed that the wafer was not eroded at the time of cleaning and that residues of the protecting film did not remain after UV irradiation.

Example 106

The procedure was the same as Example 2 with the exception that a material in which the total quantity of the water content in the starting material was 5500 mass ppm relative to the total quantity of the raw material was used. As an evaluation result, the contact angle after the surface treatment was 70 and therefore exhibited the water repellency-providing effect. Furthermore, the capillary force when water was retained was 1.1 MN/m$^2$ and therefore low. Additionally, the contact angle after UV irradiation was smaller than 10°, so that removal of the protecting film was achieved. Furthermore, the Ra value of the wafer after UV irradiation was smaller than 0.5 nm, with which it was confirmed that the wafer was not eroded at the time of cleaning and that residues of the protecting film did not remain after UV irradiation.

Comparative Example 1

The procedure was the same as Example 1 with the exception that the liquid chemical for forming the protecting film was not provided to the silicon wafer. In other words, in the present comparative example, a wafer under a condition not provided with water repellency was evaluated. As an evaluation result, the contact angle of the wafer after the surface treatment was 3° as shown in Table 5 and therefore low. The capillary force when water was retained was 3.2 MN/m$^2$ and therefore high.

TABLE 5

| | Liquid Chemical for forming Protecting Film Starting Material | | | | Treatment after Surface Treatment with Liquid Chemical for forming Protecting Film | |
|---|---|---|---|---|---|---|
| | Silicon Compound A | Concentration of Silicon Compound A [mass %] | Acid other than Acids A and B | Organic Solvent | Drying | Cleaning with Solvent |
| Comparative Example 1 | Not Treated | — | — | — | Not Performed | Performed |
| Comparative Example 2 | (H$_3$C)$_3$Si—NH—Si(CH$_3$)$_3$ | 1 | — | PGMEA | Not Performed | Performed |
| Comparative Example 3 | (H$_3$C)$_3$Si—NH—Si(CH$_3$)$_3$ | 1 | CH$_3$S(O$_2$)—OH | PGMEA | Not Performed | Performed |
| Comparative Example 4 | (H$_3$C)$_3$Si—NH—Si(CH$_3$)$_3$ | 1 | CH$_3$COOH | PGMEA | Not Performed | Performed |
| Comparative Example 5 | (H$_3$C)$_3$Si—NH—Si(CH$_3$)$_3$ | 1 | H$_2$SO$_4$ | PGMEA | Not Performed | Performed |
| Comparative Example 6 | (H$_3$C)$_3$Si—NH—Si(CH$_3$)$_3$ | 1 | H$_3$PO$_4$ | PGMEA | Not Performed | Performed |
| Comparative Example 7 | (H$_3$C)$_3$Si—NH—Si(CH$_3$)$_3$ | 1 | HCl | PGMEA | Not Performed | Performed |
| Comparative Example 8 | (H$_3$C)$_3$Si—NH—Si(CH$_3$)$_3$ | 1 | HNO$_3$ | PGMEA | Not Performed | Performed |

| | Treatment after Surface Treatment with Liquid Chemical for forming Protecting Film | | Evaluation Results | | | | |
|---|---|---|---|---|---|---|---|
| | Cleaning with Water | Drying | Initial Contact Angle [°] | Contact Angle after Surface Treatment [°] | Capillary Force [MN/m$^2$] <Calculated Value> | Removability of Protecting Film (Contact Angle [°]) | Surface Smoothness (Ra [nm]) |
| Comparative Example 1 | Performed | Performed | <10 | 3 | 3.2 | — | — |
| Comparative Example 2 | Performed | Performed | <10 | 28 | 2.8 | — | — |
| Comparative Example 3 | Performed | Performed | <10 | 68 | 1.2 | — | — |
| Comparative Example 4 | Performed | Performed | <10 | 64 | 1.4 | — | — |
| Comparative Example 5 | Performed | Performed | <10 | 64 | 1.4 | — | — |
| Comparative Example 6 | Performed | Performed | <10 | 60 | 1.6 | — | — |
| Comparative Example 7 | Performed | Performed | <10 | 20 | 3.0 | — | — |
| Comparative Example 8 | Performed | Performed | <10 | 68 | 1.2 | — | — |

Comparative Example 2

The procedure was the same as Example 1 with the exception that the liquid chemical for forming the protecting film was obtained by mixing 1.0 g of hexamethyldisilazane and 99.0 g of PGMEA. In other words, in the present comparative example, a liquid chemical not containing acid was used. As an evaluation result, the contact angle of the wafer after the surface treatment was 28° as shown in Table 5 and therefore low. The capillary force when water was retained was 2.8 MN/m$^2$ and therefore high.

Comparative Examples 3 to 8

The surface treatment was conducted on the wafer upon modifying the acid A used in Example 1. Then, evaluation was performed thereon. The result is shown in Table 5.

In Table, [CH₃S(O₂)—OH] means methansulfonic acid. [CH₃COOH] means acetic acid. [H₂SO₄] means sulfuric acid (its water content was 2 mass %). [H₃PO₄] means phosphoric acid (its water content was 15 mass %). [HCl] means hydrochloric acid (its water content was 65 mass %). [HNO₃] means nitric acid (its water content was 31 mass %).

The surface treatment was conducted under the same conditions with the exception that Example 1 used the acid A while Comparative Examples 3 to 8 used acid other than the acid A. It was confirmed that Example 1 in which trimethylsilyl trifluoroacetate serving as the acid A was used was the only one that could impart an excellent water repellency to the wafer surface. On the other hand, it was confirmed that Comparative Examples 3 to 8 could not impart a sufficient water repellency to the silicon wafer. The liquid chemical capable of imparting a sufficient water repellency to the surface of the silicon wafer is a liquid chemical capable of reacting the silicon compound A with silanol group serving as the reaction site of surface of the silicon wafer thereby chemically bonding the silicon compound A to Si element in the silicon wafer through siloxane bond. It is therefore suggested that trimethylsilyl trifluoroacetate serving as the acid A increases reaction rate of the liquid chemical significantly.

Examples 35 to 38, 47 to 50, 68 to 71, 90 to 93 and 95 and 96 used the silicon compound A having hydrocarbon group relatively high in volume, as $R^1$ of the general formula [1]. Such a silicon compound A can react with silanol group serving as the reaction site of the surface of the silicon wafer thereby coating Si element in the silicon wafer with hydrocarbon groups relatively high in volume, so as to be able to impart water repellency to the wafer surface with efficiency. It will be understood that water repellency can be more efficiently imparted to the wafer surface by combining the silicon compound A having hydrocarbon group relatively high in volume and the acid A capable of significantly increasing the reaction rate of the liquid chemical.

Referential Examples 1 to 4

The surface treatment was conducted on the wafer upon suitably modifying the silicon compound A and the organic solvent which were used in Example 1, in the use of trimethylchlorosilane [CH₃)₃SiCl] serving as acid other than the acid A. Then, evaluation was performed thereon. Results of them are shown in Table 6. The liquid chemical used in the present referential examples exhibited a whitish appearance at the time of preparation and additionally precipitated components were confirmed therein; however, the contact angle was 78 to 84° with little change, so that the effect equal to the liquid chemical of the examples of the present invention was obtained.

TABLE 6

| | Liquid Chemical for forming Protecting Film Starting Material | | | | Treatment after Surface Treatment | |
|---|---|---|---|---|---|---|
| | Silicon Compound A | Concentration of Silicon Compound A [mass %] | Acid other than Acids A and B | Organic Solvent | Drying | Cleaning with Solvent |
| Referential Example 1 | (H₃C)₃Si—NH—Si(CH₃)₃ | 1 | (CH₃)₃SiCl | PGMEA | Not Performed | Performed |
| Referential Example 2 | (H₃C)₃Si—NH—Si(CH₃)₃ | 1 | (CH₃)₃SiCl | HFE-7100/PGMEA | Not Performed | Performed |
| Referential Example 3 | (H₃C)₂Si(H)—NH—Si(H)(CH₃)₂ | 1 | (CH₃)₃SiCl | PGMEA | Not Performed | Performed |
| Referential Example 4 | (H₃C)₂Si(H)—NH—Si(H)(CH₃)₂ | 1 | (CH₃)₃SiCl | HFE-7100/PGMEA | Not Performed | Performed |

| | Treatment after Surface Treatment with Liquid Chemical for forming Protecting Film | | Evaluation Results | | | | |
|---|---|---|---|---|---|---|---|
| | Cleaning with Water | Drying | Initial Contact Angle [°] | Contact Angle after Surface Treatment [°] | Capillary Force [MN/m²] <Calculated Value> | Removability of Protecting Film (Contact Angle [°]) | Surface Smoothness (Ra [nm]) |
| Referential Example 1 | Performed | Performed | <10 | 78 | 0.7 | A (<10) | A (<0.5) |
| Referential Example 2 | Performed | Performed | <10 | 78 | 0.7 | A (<10) | A (<0.5) |
| Referential Example 3 | Performed | Performed | <10 | 80 | 0.6 | A (<10) | A (<0.5) |
| Referential Example 4 | Performed | Performed | <10 | 84 | 0.3 | A (<10) | A (<0.5) |

EXPLANATION OF REFERENCE NUMERALS

1 Wafer
2 Finely uneven pattern on a wafer surface
3 Projected portions of the pattern
4 Recessed portions of the pattern
5 Widths of the recessed portions
6 Heights of the projected portions
7 Widths of the projected portions
8 Liquid chemical retained in the recessed portions 4
9 Water-based cleaning liquid retained in the recessed portions 4
10 Protecting film

The invention claimed is:

1. A process for cleaning a surface of a wafer having a finely uneven pattern at the surface and containing silicon element at at least a part of the uneven pattern, comprising the step of:
retaining a liquid chemical for forming a water-repellent protecting film, at least on surfaces of recessed portions of the uneven pattern, thereby forming a water-repellent protecting film at least on the surfaces of the recessed portions of the uneven pattern,
wherein the liquid chemical comprises:
a silicon compound A represented by the following general formula [1]

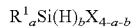   [1]

where $R^1$ mutually independently represents at least one group selected from a monovalent organic group having hydrocarbon group of which carbon number is 1 to 18 and a monovalent organic group having a fluoroalkyl chain of which carbon number is 1 to 8, X mutually independently represents a monovalent organic group of which element to be bonded to Si element is nitrogen, a is an integer of from 1 to 3, b is an integer of from 0 to 2, and the total of a and b is 1 to 3; and
at least one acid selected from the group consisting of trimethylsilyl trifluoroactate, trimethylsilyl trifluoromethanesulfonate, dimethylsilyl, trifluoroactate, dimethylsilyl trifluoromethanesulfonate, butyldimethylsilyl trifluoroactate, butyldimethylsilyl trifluoromethanesulfonate, hexyldimethylsilyl trifluoroactate hexyldimethylsilyl trifluoromethanesulfonate, octyldimethylsilyl trifluoroactate, octyldimethylsilyl trifluoromethanesulfonate, decyldimethylsilyl trifluoroactate and decyldimethylsilyl trifluoromethanesulfonate.

2. A process for cleaning a surface of a wafer having a finely uneven pattern at the surface, as claimed in claim 1, wherein the total quantity of water content in a starting material for the liquid chemical is not higher than 5000 mass ppm relative to the total quantity of the starting material.

3. A process for cleaning a surface of a wafer having a finely uneven pattern at the surface, as claimed in claim 1, wherein the number of particles of larger than 0.5 μm is not more than 100 per 1 mL of the liquid chemical, in a particle measurement conducted in a liquid phase of the liquid chemical by a light-scattering type detector for particles in liquid.

4. A process for cleaning a surface of a wafer having a finely uneven pattern at the surface, as claimed in claim 1, wherein the content of each element of Na, Mg, K, Ca, Mn, Fe, and Cu serving as metal impurities is not more than 100 mass ppb relative to the total quantity of the liquid chemical.

5. A process for cleaning a surface of a wafer having a finely uneven pattern at the surface, as claimed in claim 1, further comprising the steps of:
removing the water-repellent protecting film from the surface of the wafer.

6. A process for cleaning a surface of a wafer having a finely uneven pattern at the surface, as claimed in claim 5, wherein the step of removing the water-repellent protecting film from the surface of the wafer comprises at least one treatment selected from irradiating the surface of the wafer with light, heating the wafer, exposing the wafer to ozone, and irradiating the surface of the wafer with plasma.

* * * * *